(12) United States Patent
Li et al.

(10) Patent No.: US 12,112,802 B2
(45) Date of Patent: Oct. 8, 2024

(54) MEMORY DEVICE, THE OPERATION METHOD THEREOF AND MEMORY SYSTEM

(71) Applicant: YANGTZE MEMORY TECHNOLOGIES CO., LTD., Wuhan (CN)

(72) Inventors: Zhihong Li, Wuhan (CN); Jing Wei, Wuhan (CN); Masao Kuriyama, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 164 days.

(21) Appl. No.: 17/974,271

(22) Filed: Oct. 26, 2022

(65) Prior Publication Data
US 2024/0029793 A1 Jan. 25, 2024

(30) Foreign Application Priority Data
Jul. 21, 2022 (CN) .......................... 202210864398.8

(51) Int. Cl.
*G11C 16/04* (2006.01)
*G11C 16/08* (2006.01)
*G11C 16/10* (2006.01)
*G11C 16/26* (2006.01)

(52) U.S. Cl.
CPC .......... *G11C 16/0433* (2013.01); *G11C 16/08* (2013.01); *G11C 16/102* (2013.01); *G11C 16/26* (2013.01)

(58) Field of Classification Search
None
See application file for complete search history.

(56) References Cited

U.S. PATENT DOCUMENTS

| 11,636,887 B2 * | 4/2023 | Kang ........................ G11C 8/08 365/63 |
| 11,735,248 B2 * | 8/2023 | Lee .......................... G11C 8/14 365/230.06 |
| 11,790,980 B2 * | 10/2023 | He ....................... G11C 11/4085 365/149 |
| 2009/0109738 A1 * | 4/2009 | Donze .................... G11C 13/02 365/163 |

(Continued)

*Primary Examiner* — Tan T. Nguyen
(74) *Attorney, Agent, or Firm* — BAYES PLLC

(57) ABSTRACT

The present disclosure provides a memory device comprising a memory cell array and a peripheral circuit coupled to the memory cell array. The memory cell array includes a plurality of memory planes; the peripheral circuit includes a plurality of selected voltage selection circuits corresponding to the plurality of memory planes; a plurality of global word line voltage selection circuits respectively corresponding to each memory plane, and a plurality of local word line voltage selection circuits respectively corresponding to each memory plane. The plurality of selected voltage selection circuits are configured to select a voltage from a plurality of selected voltages to output to the global word line voltage selection circuits; the global word line voltage selection circuits are configured to select a voltage from unselected voltages and the voltage output from the plurality of selected voltage selection circuits to output to the local word line voltage selection circuits.

20 Claims, 14 Drawing Sheets

(56) References Cited

U.S. PATENT DOCUMENTS

2014/0112061 A1* 4/2014 Jung .................. G11C 11/419
365/154
2023/0079077 A1* 3/2023 Hemati ................ G11C 7/222
365/189.09

* cited by examiner

MEMORY DEVICE, THE OPERATION METHOD THEREOF AND MEMORY SYSTEM

CROSS-REFERENCE TO RELATED APPLICATIONS

The present application claims the benefit of priority to China Application No. 202210864398.8, filed on Jul. 21, 2022, the content of which is incorporated herein by reference in its entirety.

TECHNICAL FIELD

The present disclosure relates to the field of semiconductor technology, and in particular, to a memory device, an operation method thereof, and a memory system.

BACKGROUND

Memory is a memory device used to save information in modern information technology. As a typical non-volatile semiconductor memory device, NAND (Not-And) flash memory device has become a mainstream product in the market due to its high storage density, controllable production cost, suitable programming and erasing speed, and retention characteristics.

With the increasing requirements of memory devices, how to reduce the area of the memory device has become one of the technical problems that need to be solved urgently.

SUMMARY

According to the first aspect of the embodiments of the present disclosure, there is provided a memory device comprising a memory cell array and a peripheral circuit coupled to the memory cell array; the memory cell array includes a plurality of memory planes; the peripheral circuit includes a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane; the plurality of selected voltage selection circuits are configured to select a voltage from a plurality of selected voltages to output to the global word line voltage selection circuits; the global word line voltage selection circuits are configured to select a voltage from unselected voltages and the voltage output from the plurality of selected voltage selection circuits to output to the local word line voltage selection circuits; during a program operation, the plurality of memory planes share the plurality of selected voltage selection circuits; and during a read operation, each memory plane uses a part of the plurality of selected voltage selection circuits respectively to perform voltage selection.

In the above solution, during the program operation, the number of the selected voltages corresponding to the plurality of memory planes is a, and the number of the selected voltage selection circuits corresponding to the plurality of memory planes is at least and during the read operation, the number of the selected voltages corresponding to each memory plane is b, and the number of the selected voltage selection circuits corresponding to each memory plane is at least b; the number of the memory planes is c, and the relationship among a, b, and c is: $a \geq b*c$; wherein, both the a and the b are positive integers greater than 0, and the c is a positive integer greater than 1.

In the above solution, the peripheral circuit further comprises a plurality of global word lines corresponding to the global word line voltage selection circuits one-to-one; during the program operation, the number of the selected voltage selection circuits corresponding to the plurality of memory planes is a, and adjacent a global word lines on each memory plane correspond to different selected voltage selection circuits; during the read operation, the global word lines on different memory planes correspond to different selected voltage selection circuits, the number of the selected voltage selection circuits corresponding to each memory plane is b, and adjacent b global word lines on each memory plane correspond to different selected voltage selection circuits.

In the above solution, the peripheral circuit further comprises a plurality of unselected voltage selection circuits corresponding to the plurality of memory planes; each unselected voltage selection circuit corresponds to the plurality of local word line voltage selection circuits on one memory plane, each local word line voltage selection circuit corresponds to one unselected voltage selection circuit; each of the plurality of unselected voltage selection circuits is configured to select a voltage from at least one unselected voltage to output to the local word line voltage selection circuits; during the program operation, the plurality of memory planes share the plurality of unselected voltage selection circuits; during the read operation, each memory plane uses a part of the plurality of unselected voltage selection circuits respectively to perform voltage selection.

In the above solution, during the program operation, the number of the unselected voltages corresponding to the plurality of memory planes is d, and the number of the unselected voltage selection circuits corresponding to the plurality of memory planes is at least d; during the read operation, the number of the unselected voltages corresponding to each memory plane is e, and the number of the unselected voltage selection circuits corresponding to each memory plane is at least e; the number of the memory planes is c, and the relationship among c, d and e is: $d \geq e*c$; wherein, both the d and the e are positive integers greater than 0, and the c is a positive integer greater than 1.

In the above solution, each of the memory planes comprises a plurality of word lines; the peripheral circuit further includes a plurality of global word lines corresponding to the global word line voltage selection circuits one-to-one, and a plurality of local word lines corresponding to the local word line voltage selection circuits one-to-one; wherein, each of the global word lines corresponds to the plurality of local word lines; each local word line corresponds to one global word line, and each local word line corresponds to one word line; the global word line voltage selection circuits output the voltage to the local word line voltage selection circuits through the global word lines; the local word line voltage selection circuits output the voltage to corresponding word lines through the local word lines.

In the above solution, the selected voltage selection circuits, the global word line voltage selection circuits, the local word line voltage selection circuits and the unselected voltage selection circuits all comprise a multiplexer.

According to the second aspect of the embodiments of the present disclosure, there is provided a memory system, and the memory system comprises: one or more memory devices according to any of the above schemes; and a memory controller coupled to and controlling, the memory device.

In the above solution, the memory system comprises a memory card or a solid-state hard disk.

According to the third aspect of the embodiments of the present disclosure, there is provided a method for operating a memory device which comprises a memory cell array and a peripheral circuit coupled to the memory cell array; the memory cell array includes a plurality of memory planes; the peripheral circuit includes a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane; the plurality of selected voltage selection circuits are configured to select a voltage from a plurality of selected voltages to output to the global word line voltage selection circuits; the global word line voltage selection circuits are configured to select a voltage from unselected voltages and the voltage output from the plurality of selected voltage selection circuits to output to the local word line voltage selection circuits; the method includes: receiving a first instruction, the first instruction is configured to simultaneously perform a program operation on the plurality of memory planes; applying a plurality of different voltages output by the plurality of selected voltage selection circuits to each memory plane in response to the first instruction; receiving a second instruction, the second instruction is configured to perform a read operation on the plurality of memory planes; applying a part of the plurality of different voltages output by the plurality of selected voltage selection circuits respectively to different memory planes in response to the second instruction.

In the above solution, during the program operation performed on the plurality of memory planes simultaneously, the number of the selected voltages corresponding to the plurality of memory planes is a, and the number of the selected voltage selection circuits corresponding to the plurality of memory planes is at least a; and during the read operation performed on the plurality of memory planes, the number of the selected voltages corresponding to each memory plane is b, and the number of the selected voltage selection circuits corresponding to each memory plane is at least b; the number of the memory planes is c, and the relationship among a, b and c is: $a \geq b*c$; wherein, both the a and the b are positive integers greater than 0, and the c is a positive integer greater than 1.

In the above solution, the peripheral circuit further comprises a plurality of global word lines corresponding to the global word line voltage selection circuits one-to-one; during the program operation performed on the plurality of memory planes simultaneously, the number of the selected voltage selection circuits corresponding to the plurality of memory planes is a, and adjacent a global word lines on each memory plane correspond to different selected voltage selection circuits; during the read operation performed on the plurality of memory planes, the global word lines on different memory planes correspond to different selected voltage selection circuits, the number of the selected voltage selection circuits corresponding to each memory plane is b, and adjacent b global word lines on each memory plane correspond to different selected voltage selection circuits.

In the above solution, the peripheral circuit further comprises a plurality of unselected voltage selection circuits corresponding to the plurality of memory planes; each unselected voltage selection circuit corresponds to the plurality of local word line voltage selection circuits on one memory plane, each local word line voltage selection circuit corresponds to one unselected voltage selection circuit; each of the plurality of unselected voltage selection circuits is configured to select a voltage from at least one unselected voltage to output to the local word line voltage selection circuits; the method further includes: applying a plurality of different unselected voltages output by the plurality of unselected voltage selection circuits to each memory plane in response to the first instruction, applying a part of the plurality of different voltages output by the plurality of unselected voltage selection circuits respectively to different memory planes in response to the second instruction.

In the above solution, during the program operation, the number of the unselected voltages corresponding to the plurality of memory planes is d, and the number of the unselected voltage selection circuits corresponding to the plurality of memory planes is at least d; during the read operation, the number of the unselected voltages corresponding to each memory plane is e, and the number of the unselected voltage selection circuits corresponding to each memory plane is at least e; the number of the memory planes is c, and the relationship among c, d and e is: $d \geq e*c$; wherein, both the d and the e are positive integers greater than 0, and the c is a positive integer greater than 1.

In the above solution, each of the memory planes comprises a plurality of word lines; the peripheral circuit further includes a plurality of global word lines corresponding to the global word line voltage selection circuits one-to-one, and a plurality of local word lines corresponding to the local word line voltage selection circuits one-to-one; wherein, each of the global word lines corresponds to the plurality of local word lines; each local word line corresponds to one global word line, and each local word line corresponds to one word line; the global word line voltage selection circuits output the voltage to the local word line voltage selection circuits through the global word lines; the local word line voltage selection circuits output the voltage to corresponding word lines through the local word lines.

In the above solution, an Asynchronous Multi-plane Independent (AMPI) read method is used to perform the read operation on the plurality of memory planes during the read operation performed on the plurality of memory planes.

Embodiments of the present disclosure provide a memory device, an operation method thereof, and a memory system. The memory device comprises a memory cell array and a peripheral circuit coupled to the memory cell array; the memory cell array includes a plurality of memory planes; the peripheral circuit includes a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane; the plurality of selected voltage selection circuits are configured to select a voltage from a plurality of selected voltages to output to the global word line voltage selection circuits; the global word line voltage selection circuits are configured to select a voltage from unselected voltages and the voltage output from the plurality of selected voltage selection circuits to output to the local word line voltage selection circuits; during a program operation, the plurality of memory planes share the plurality of selected voltage selection circuits; and during a read operation, each memory plane uses a part of the plurality of selected voltage selection circuits to perform voltage selection. In the embodiment of the present disclosure, during the program operation, the plurality of memory planes share the plurality of selected voltage selection circuits, while during the read operation, each memory plane uses a part of the plurality of selected voltage selection circuits used during the program operation to perform voltage selection. That is, in the embodiment of the present disclosure, the program operation and the read operation share the selected voltage selection circuits, so that the selected voltage selection circuits required during the read operation need not to be additionally added. Thus, the total number of the selected voltage selection circuits is small, and the area of the memory device may be reduced, which is beneficial to the miniaturization of the memory device.

DETAILED DESCRIPTION

Figure 1:
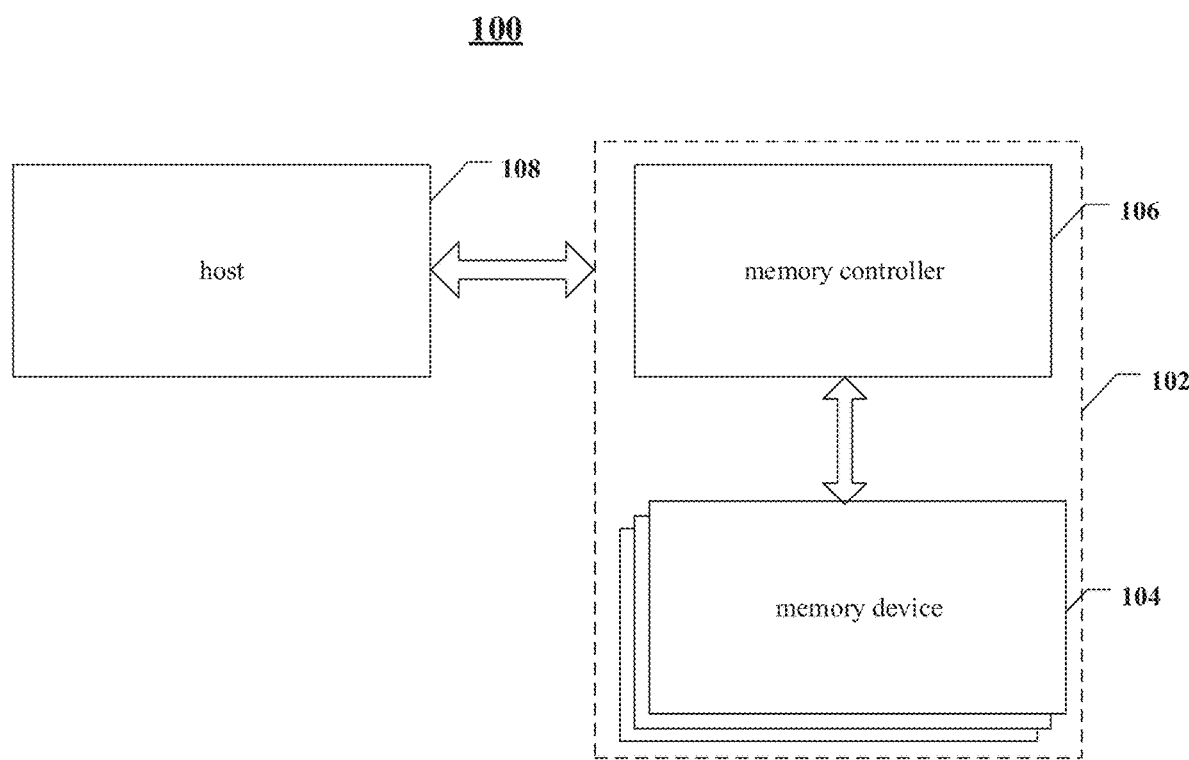
FIG. 1 is a schematic diagram of an exemplary system having a memory system according to an embodiment of the disclosure.

Exemplary implementations disclosed in the present disclosure will be described in more detail below with reference to the accompanying drawings. While exemplary implementations of the present disclosure are shown in the drawings, it should be understood that the present disclosure may be implemented in various forms and should not be limited by the detailed description set forth herein. Rather, these implementations are provided so that the present disclosure will be better understood, and will better convey the scope disclosed in the present disclosure to those skilled in the art.

In the following description, many specific details are set forth in order to provide a better understanding of the present disclosure. It will be apparent, however, to one skilled in the art that the present disclosure may be implemented without one or more of these details. In other instances, some technical features that are well known in the art have not been described in order to avoid obscuring the present disclosure: that is, not all features of actual embodiments are described herein, and well-known functions and constructions are not described in detail.

In the drawings, the sizes of layers, regions, elements, and their relative sizes may be exaggerated for clarity. The same reference numbers refer to the same elements throughout.

It will be understood that when an element or a layer is referred to as being "on", "adjacent to", "connected to" or "coupled to" other elements or layers, it can be directly on, adjacent to, connected to or coupled to other elements or layers, or intervening elements or layers may be present therebetween, in contrast, when an element is referred to as being "directly on", "directly adjacent to", "directly connected to" or "directly coupled to" other elements or layers, there are no intervening elements or layers present therebetween. It will be understood that, although the terms first, second, third, etc. may be used to describe various elements, components, regions, layers, and/or sections, these elements, components, regions, layers, and/or sections should not be limited by these terms. These terms are only used to distinguish one element, component, region, layer, or section from another. Thus, the first element, component, region, layer, or section discussed below could be referred as the second element, component, region, layer, or section without departing from the teachings of the present disclosure. The discussion of the second element, component, region, layer, or section does not imply that the first element, component, region, layer, or section is necessarily present in the present disclosure.

Spatial relational terms such as "under", "below", "lower", "beneath", "above", "upper", etc., are used herein for convenience description to describe the relationship of one element or feature to other elements or features shown in the figures. It should be understood that the spatially relative terms are intended to encompass different orientations of the device in use and operation in addition to the orientation shown in the figures. For example, if the device in the figures is flipped over, the elements or features described as "below" or "beneath" or "under" other elements or features would then be oriented "on" the other elements or features. Thus, the exemplary terms "below"

and "under" can encompass both orientations of above and below. The device may be otherwise oriented (rotated 90 degrees or at other orientations) and the spatial descriptors used herein interpreted accordingly.

The terms used herein is for the purpose of describing particular embodiments only and is not intended to be limiting of the present disclosure. As used herein, the singular forms "a", "an", and "said/the" are intended to include the plural forms as well, unless the context clearly dictates otherwise. It should also be understood that the terms "compose" and/or "include", when used in this specification, identify the presence of stated features, integers, steps, operations, elements, and/or components, but do not exclude the presence or addition of one or more other features, integers, steps, operations, elements, components, and/or groups. As used herein, the term "and/or" includes any and all combinations of the associated listed items.

In order to understand the features and technical contents of the embodiments of the present disclosure in more detail, the implementation of the embodiments of the present disclosure will be described in detail below in combination with the accompanying drawings, which are for reference only and are not intended to limit the embodiments of the present disclosure.

The memory device in the embodiments of the present disclosure includes, but is not limited to, a three-dimensional NAND memory device. For ease of understanding, a three-dimensional NAND memory device is used as an example for description.

The three-dimensional NAND memory stacks memory cells in the direction perpendicular to the substrate, which can form more memory cells in a smaller area. Compared with the two-dimensional memory device, the three-dimensional NAND memory device has a larger memory capacity and is a main development direction in the current memory field. With the increasing requirements of the three-dimensional NAND memory device, how to reduce the area of the memory device has attracted widespread attention.

In order to solve one or more of the above-mentioned problems, a solution is introduced by the embodiments of the present disclosure that can reduce the area of peripheral circuits, thereby reducing the area of a memory device.

FIG. 1 shows a block diagram of an exemplary system 100 with a memory device in accordance with some aspects of the present disclosure. System 100 may be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, the system 100 may include a host 108 and a memory system 102 having one or more memory devices 104 and a memory controller 106. Host 108 can be a processor of an electronic device, such as a central processing unit (CPU), or a system-on-chip (SoC), such as an application processor (AP). The host 108 may be configured to send data to or receive data from the memory device 104.

According to some implementations, the memory controller 106 is coupled to the memory device 104 and the host 108 and is configured to control the memory device 104. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays.

Memory controller 106 can be configured to control operations of memory device 104, such as read, erase, and program operations. Memory controller 106 can also be configured to manage various functions with respect to the data stored or to be stored in memory device 104 including, but not limited to, bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
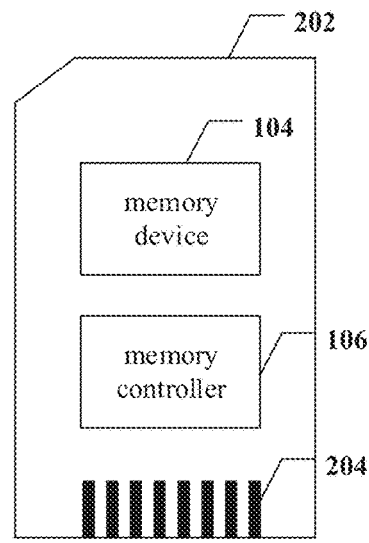
FIG. 2a is a schematic diagram of an exemplary memory card having a memory system according to an embodiment of the disclosure.
Figure 2B:
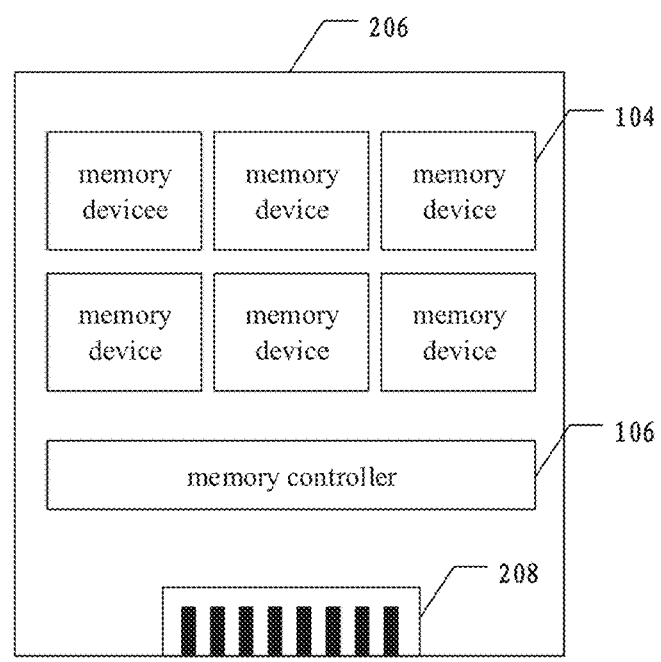
FIG. 2b is a schematic diagram of an exemplary solid state drive having a memory system according to an embodiment of the disclosure.

Memory controller 106 and one or more memory devices 104 can be integrated into various types of storage devices, for example, be included in the same package, such as a universal Flash storage (UES) package or an eMMC package. That is, memory system 102 can be implemented and packaged into different types of end electronic products. In an example as shown in FIG. 2a, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 that couples memory card 202 to a host (e.g., host 108 in FIG. 1). In another example as shown in FIG. 2b, memory controller 106 and multiple memory devices 104 may be integrated into an SSD 206. SSD 206 can further include an SSD connector 208 that couples SSD 206 to a host (e.g., host 108 in FIG. 1). In some implementations, the storage capacity and/or the operation speed of SSD 206 is greater than those of memory card 202.

Figure 3A:
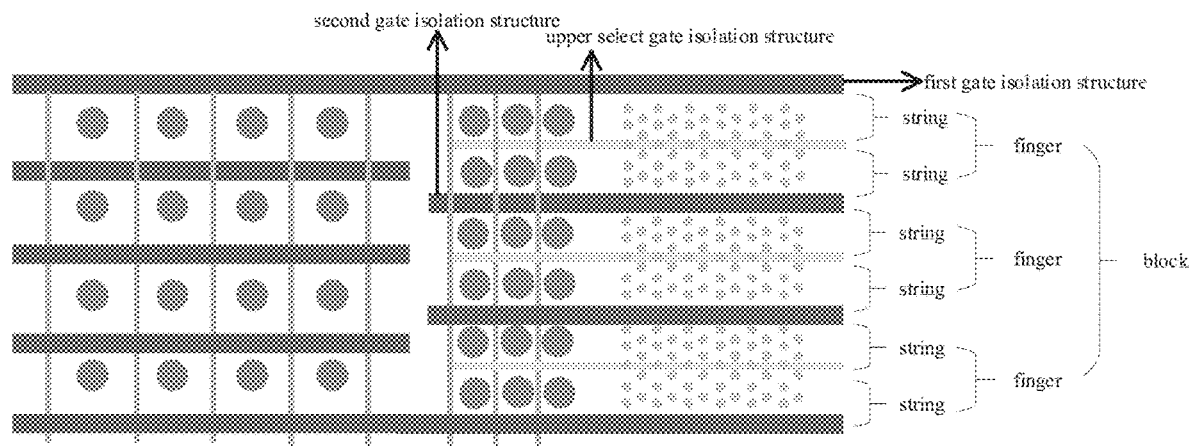
FIG. 3a is a schematic diagram of the distribution of memory cells of a three-dimensional NAND memory device according to an embodiment of the disclosure.

FIG. 3a is an exemplary schematic diagram of the structure of a memory array of a three-dimensional NAND memory device. As shown in FIG. 3a, the memory array of the three-dimensional NAND memory device consists of several rows of memory cell rows that are staggered in parallel and parallel to the gate isolation structure. Every two rows of memory cell rows are separated by a gate isolation structure and an upper select gate isolation structure, and each memory cell row includes a plurality of memory cells. The gate isolation structure may include a first gate isolation structure and a second gate isolation structure. The memory array may be divided into a plurality of blocks by the first gate isolation structure. The blocks may be divided into multiple fingers by a plurality of the second gate isolation structures. The lingers may be divided into two parts by the upper select gate isolation structure set in the middle of each finger, thereby into two strings. A block shown in FIG. 3a includes 6 strings. In practical applications, the number of strings in a block is not limited to this.

It should be noted that the number of rows of memory cell rows between the gate isolation structure and the upper select gate isolation structure shown in FIG. 3a is only exemplary, and is not used to limit the number of the memory cell rows included in a finger of the three-dimensional NAND memory device in the present disclosure. In practical applications, the number of memory cell rows included in a finger can be adjusted according to the actual situation, such as 2, 4, 8, 16, and so on.

Figure 3B:
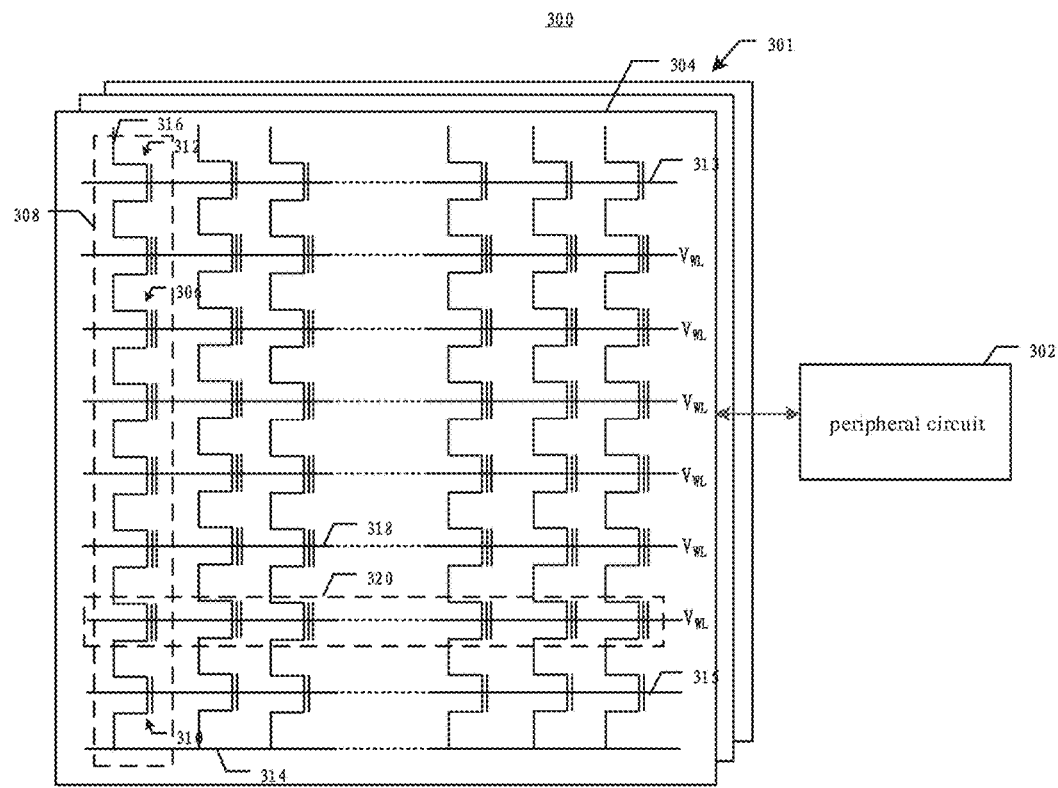
FIG. 3b is a schematic diagram of an exemplary memory device including peripheral circuits according to an embodiment of the disclosure.

FIG. 3b illustrates a schematic circuit diagram of an exemplary memory device 300 including peripheral circuits, according to some aspects of the present disclosure. Memory device 300 can be an example of memory device 104 in FIG. 1. Memory device 300 can include a memory array 301 and peripheral circuits 302 coupled to memory array 301. Taking the memory array 301 as an example of a three-dimensional NAND memory array, the memory cell 306 is provided in an array of NAND memory strings 308, each NAND memory string 308 extends vertically above a substrate (not shown). In some implementations, each NAND memory string 308 includes a plurality of memory cells 306 coupled in series and stacked vertically. Each memory cell 306 may hold a continuous analog value, e.g., a voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as a triple-level cell (TLC)), or four bits per cell (also known as a quad-level cell (QLC)). Each MLC can be programmed to assume a range of possible nominal storage values. In an example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3b, each NAND memory string 308 may include a lower select gate (BSG) 310 at its source end and an upper select gate (TSG) 312 at its drain end. BSG 310 and TSG 312 may be configured to activate the selected NAND memory strings 308 during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. According to some implementations, the TSG 312 of each NAND memory string 308 is coupled to a respective bit line (BL) 316 from which data can be read or written via an output bus (not shown). In some implementations, each NAND memory string 308 is configured to be selected or deselected by applying a select voltage (e.g., above the threshold voltage of the transistor with TSG 312) or a deselect voltage (e.g., 0V) to the respective TSG 312 via one or more TSG lines 313 and/or by applying a select voltage (e.g., above the threshold voltage of the transistor with the BSG 310) or a deselect voltage (e.g., 0V) to the respective BSG 310 via one or more BSG lines 315.

As shown in FIG. 3b, NAND memory strings 308 can be organized into multiple blocks 304, each of which can have a common source line 314, e.g., coupled to ground. In some implementations, each block 304 is the basic data unit for erase operations, i.e., all memory cells 306 on the same block 304 are erased at the same time. To erase memory cells 306 in a selected block, source lines 314 coupled to selected block 304 as well as unselected blocks 304 in the same plane as selected block 304 can be biased with an erase voltage (Vers), such as a high positive voltage (e.g., 20 V or more). It should be appreciated that in some examples, erase operations may be performed at the half block level, at the quarter block level, or at the level with any suitable number or fraction of blocks. Memory cells 306 of adjacent NAND memory strings 308 can be coupled through word lines 318 that select which row of memory cells 306 is affected by read and program operations. In some implementations, each word line 318 is coupled to a page 320 of memory cells 306, the page 320 being the basic data unit for program operation. The size of a page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates. With reference to the above FIG. 3a, a memory page 320 includes a plurality of memory cells 306, and the plurality of memory cells are isolated by the upper select gate isolation structure and the gate isolation structure. A plurality of memory cells between the upper select gate isolation structure and the gate isolation structure are arranged into a plurality of memory cell rows, and each memory cell row is parallel to the gate isolation structure and the upper select gate isolation structure. The memory cells in strings sharing the same word line form a programmable (read/write) page.

Figure 4:
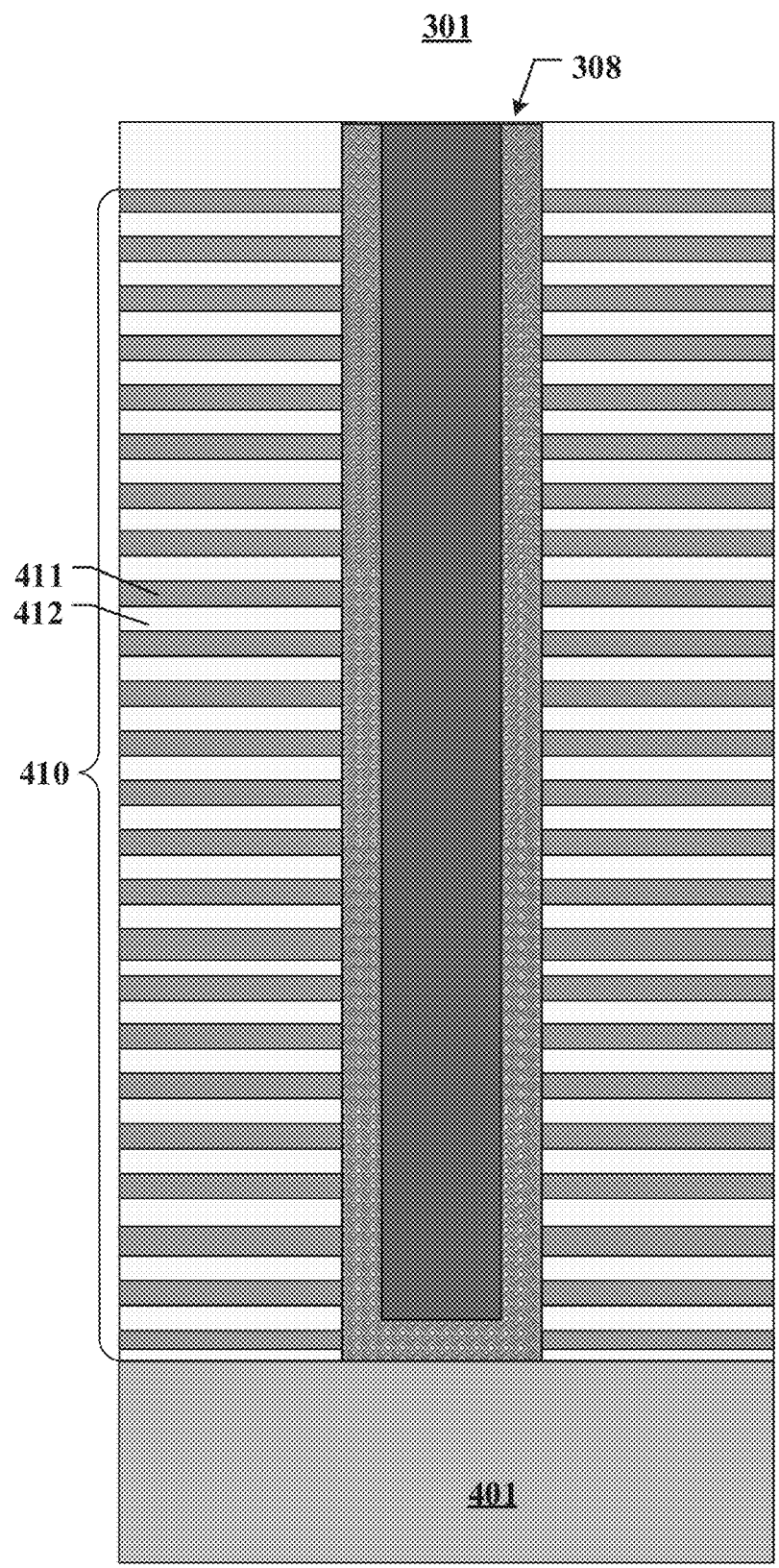
FIG. 4 is a schematic cross-sectional view of a memory array including NAND memory strings according to an embodiment of the disclosure.

FIG. 4 shows a schematic cross-sectional view of an exemplary memory array 301 including NAND memory strings 308 in accordance with some aspects of the present disclosure. As shown in FIG. 4, the NAND memory strings 308 may include a stacked structure 410. The stacked structure 410 includes a plurality of gate layers 411 and a plurality of insulating layers 412 alternately stacked in sequence, and the memory strings 308 vertically through the gate layers 411 and the insulating layers 412. The gate layers 411 and the insulating layers 412 may be alternately stacked, and adjacent two gate layers 411 are separated by an insulating layer 412. The number of pairs of the gate layer 411 and the insulating layer 412 in the stacked structure 410 may determine the number of memory cells included in the memory array 301.

The constituent material of the gate layer 411 may include conductive materials. The conductive materials include, but are not limited to, tungsten (W), cobalt (Co), copper (Cu), aluminum (Al), polysilicon, doped silicon, silicide, or any combination thereof. In some implementations, each gate layer 411 includes a metal layer, e.g., a tungsten layer. In some implementations, each gate layer 411 includes a doped polysilicon layer. Each gate layer 411 may include a control gate surrounding the memory cells. The gate layer 411 at the top of the stacked structure 410 may extend laterally as an upper select gate line, and the gate layer 411 at the bottom of the stacked structure 410 may extend laterally as a lower select gate line. The gate layer 411 extending laterally between the upper select gate line and the lower select gate line may serve as a word line layer.

In some embodiments, the stacked structure 410 may be disposed on the substrate 401. The substrate 401 may comprise silicon (e.g., single crystal silicon), silicon germanium (SiGe), gallium arsenide (GaAs), germanium (Ge), silicon on insulator (SOI), germanium on insulator (GOI), or any other suitable material.

In some embodiments, the NAND memory strings 308 include channel structures extending vertically through the stacked structure 410. In some implementations, the channel structure includes channel holes filled with a semiconductor material(s) (e.g., as a semiconductor channel) and a dielectric material(s) (e.g., as a memory film). In some implementations, the semiconductor channel includes silicon, e.g., polysilicon. In some implementations, the memory film is a composite dielectric layer that includes a tunneling layer, a storage layer (also referred to as a "charge trap/storage layer") and a blocking layer. The channel structure may have a cylindrical shape (e.g., a pillar shape). According to some implementations, the semiconductor channel, the tunneling layer, the storage layer, and the blocking layer are radially arranged in this order from the center of the pillar toward the outer surface of the pillar. The tunneling layer may include silicon oxide, silicon oxynitride, or any combination thereof. The storage layer may include silicon nitride, oxynitride, or any combination thereof. The blocking layer may include silicon oxide, silicon oxynitride, high dielectric constant (high-k) dielectrics, or any combination thereof. In one example, the memory film may include a composite layer of silicon oxide/silicon oxynitride/silicon oxide (ONO).

Figure 5:
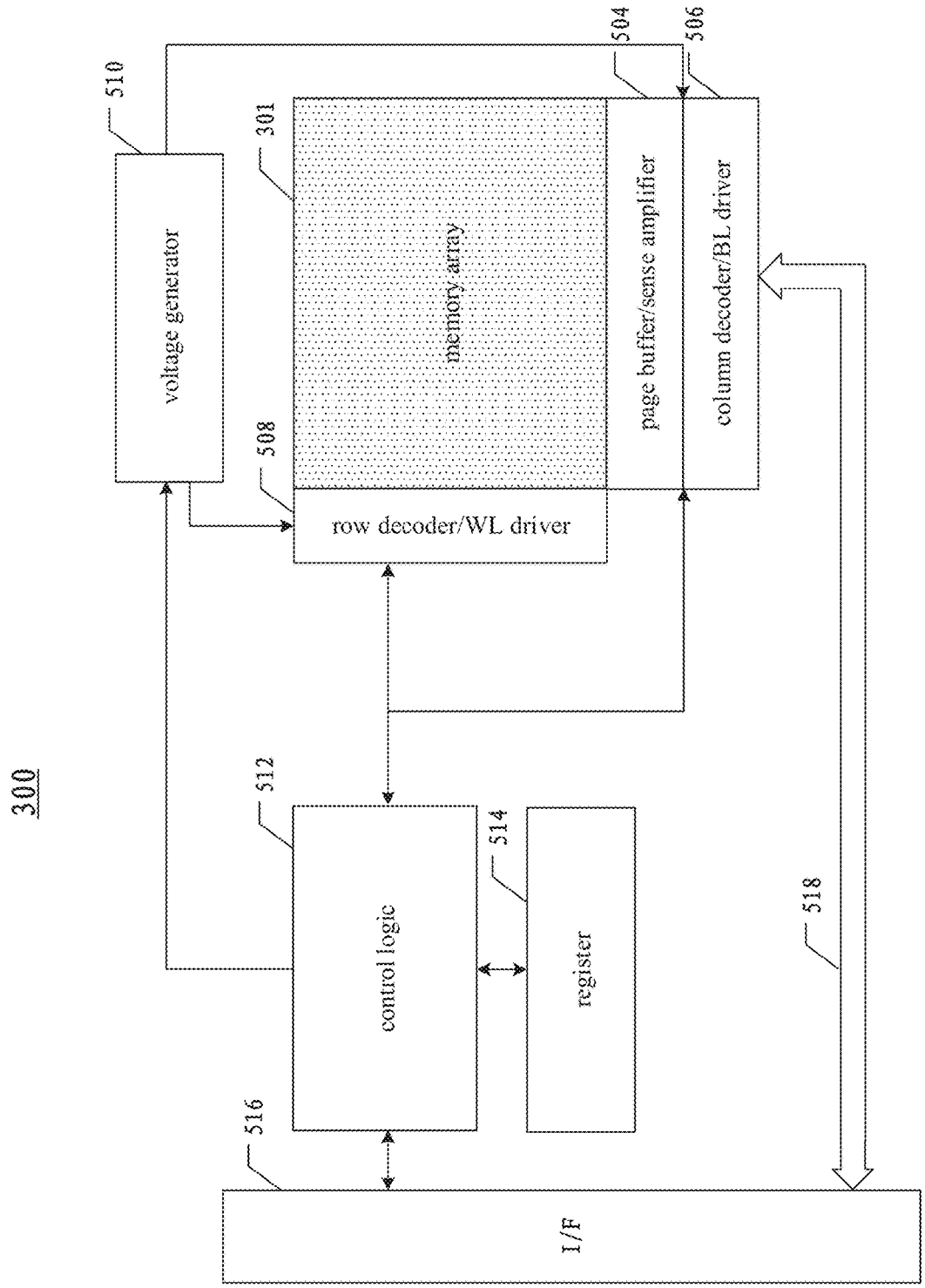
FIG. 5 is a schematic diagram of an exemplary memory device including a memory array and peripheral circuits according to an embodiment of the disclosure.

Referring back to FIG. 3b, the peripheral circuits 302 may be coupled to memory array 301 through bit lines 316, word lines 318, source lines 314, BSG lines 315 and TSG lines 313. The peripheral circuits 302 may include any suitable analog, digital and mixed-signal circuits for facilitating the operations of the memory array 301 by applying voltage and/or current signals to each target memory cell 306 via bit lines 316, word lines 318, source lines 314, BSG lines 315 and TSG lines 313 and sensing the voltage and/or current signals therefrom. The peripheral circuits 302 may include various types of peripheral circuits formed using metal-oxide-semiconductor (MOS) technology. For example, FIG. 5 shows some exemplary peripheral circuits, the peripheral circuits 302 include a page buffer/sense amplifier 504, a column decoder/bit line driver 506, a row decoder/word line driver 508, a voltage generator 510, control logic 512, registers 514, an interface 516, and a data bus 518. It should be understood that in some examples, additional peripheral circuits not shown in FIG. 5 may also be included.

Page buffer/sense amplifier 504 can be configured to read and program (write) data from and to memory array 301 according to the control signals from control logic 512. In an example, page buffer/sense amplifier 504 may store one page of program data (write data) to be programmed into one page 320 of memory array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 may be configured to be controlled by control logic 512 and to select/deselect blocks 304 of memory array 301 and to select/deselect word lines 318 of blocks 304. Row decoder/word line driver 508 may also be configured to drive word lines 318 using word line voltages generated from voltage generator 510. In some implementations, row decoder/word line driver 508 may also select/deselect and drive BSG lines 315 and TSG lines 313. As described in detail below, row decoder/word line driver 508 is configured to perform program operations on memory cells 306 coupled to selected word line(s) 318. Voltage generator 510 may be configured to be controlled by control logic 512 and to generate word line voltages (e.g., read voltages, program voltages, pass voltages, local voltages, verify voltages, etc.) to be supplied to memory array 301, bit line voltages and source line voltages.

In some embodiments, the program operation may include multiple steps. Exemplarily, the program operation may include a bit line setting step, a program execution step, and a program recovery step. A program verification operation also is needed to be performed after the program operation is performed; and a program verification recovery operation also is needed to be performed after the program verification operation is performed. During the bit line setting step of performing the program operation, the voltages may be maintained at the ground voltage GND for the unselected word lines. During the program execution step of performing the program operation, the pass voltage $V_{pass}$ may be applied to the unselected word lines, and the program voltage $V_{gm}$ may be applied to the selected word lines. Thus, the memory cells connected to the selected word lines can be programmed. During the program recovery step of performing the program operation, the voltages applied to all word lines may be lowered to the ground voltage GND. During performing program verification operation, the verify voltage $V_{vrf}$ may be applied to the selected word lines, and the read voltage $V_{rd}$ may be applied to the unselected word lines. During performing program verification recovery operation, the recovery operation that lowers the voltages to the ground voltage GND may be performed on both the unselected word lines and the selected word lines.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a host (not shown) to control logic 512 and status information received from control logic 512 to the host. Interface 516 can also be coupled to column decoder/bit line driver 506 via data bus 518 and act as a data I/O interface and a data buffer to buffer and relay the data to and from memory array 301.

In a three-dimensional NAND memory device, one chip may include multiple dies that can independently perform NAND operations (e.g., read, write, and erase). Each die may include a plurality of memory planes, and each memory plane may include a plurality of memory cells stacked vertically to increase storage capacity per unit area In a multi-plane read operation, the word line addresses of all selected memory planes are required to be the same, and the read operations of multiple planes are required to be synchronized, so that the read operations among the plurality of memory planes restrict each other and the read speed is slow. To support fast read operations, in some embodiments, the peripheral circuits can be configured to support asynchronous multi-plane independent read operations, which means that the word line address, page type, and memory cell type for each memory plane can be independently selected. And, the read operation of each memory plane can be performed in one step, that is, the plurality of memory planes can perform asynchronous independent read operations. In the asynchronous multi-plane independent read operations, if the selected word line addresses and page types are different, each memory plane requires different word line bias conditions, so that each memory plane should have a circuit for selecting different voltages, which will significantly increase the area of peripheral circuits.

A memory device is provided in an embodiment of the disclosure, which comprises a memory cell array and a peripheral circuit coupled to the memory cell array; the memory cell array includes a plurality of memory planes; the peripheral circuit includes a plurality of first selected voltage selection circuits corresponding to the plurality of memory planes, a plurality of second selected voltage selection circuits respectively corresponding to each memory plane, a plurality of global word line voltage selection circuits respectively corresponding to each memory plane, and a plurality of local word line voltage selection circuits respectively corresponding to each memory plane; the first and second selected voltage selection circuits are configured to select a voltage from a plurality of selected voltages to output to the global word line voltage selection circuits; the global word line voltage selection circuits are configured to select a voltage from unselected voltages and the voltage output from the first or second selected voltage selection circuits to output to the local word line voltage selection circuits; during a program operation, the plurality of memory planes share the plurality of first selected voltage selection circuits; and during a read operation, each memory plane uses a part of the plurality of second selected voltage selection circuits to perform voltage selection.

In some examples, the row decoder/WL driver shown in FIG. 5 includes the first selected voltage selection circuits, the second selected voltage selection circuits, the global word line voltage selection circuits, the local word line voltage selection circuits here, and the following-mentioned unselected voltage selection circuits and the selected voltage selection circuits.

Figure 6A:
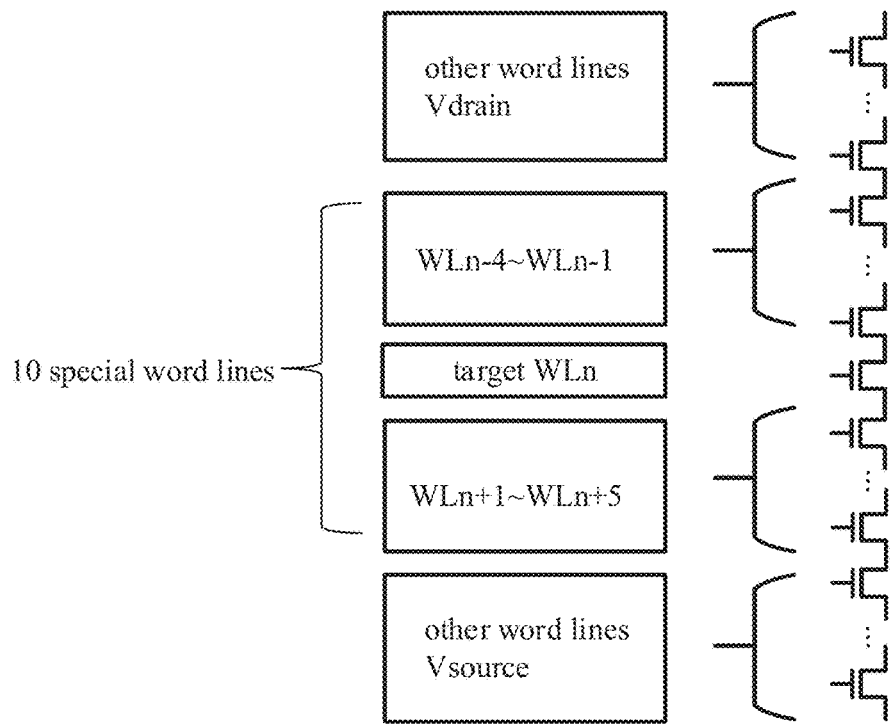
FIG. 6a is a schematic diagram of the word line voltages during a program operation according to an embodiment of the present disclosure.
Figure 6B:
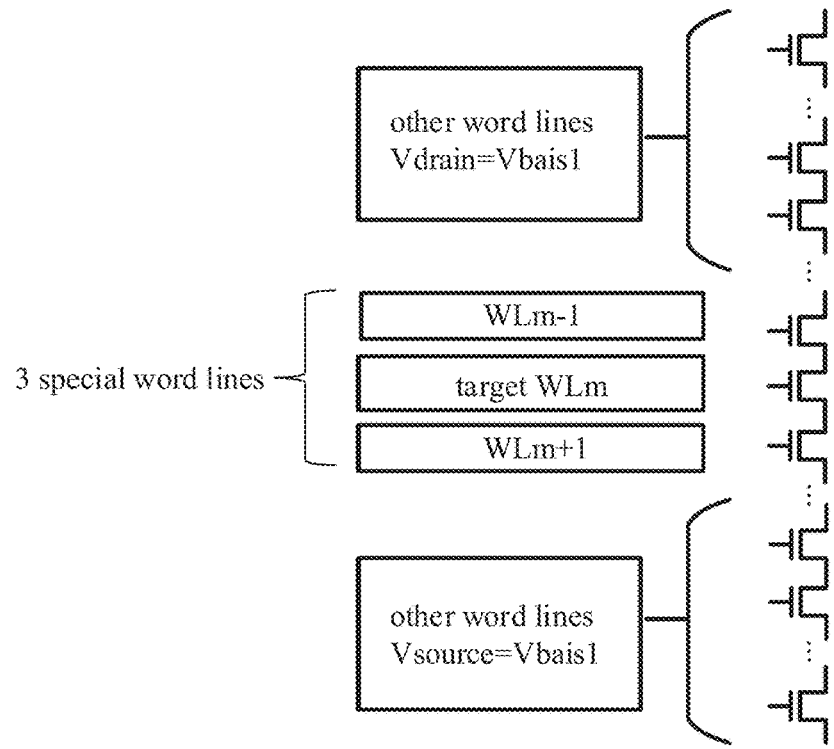
FIG. 6b is a schematic diagram of the word line voltages during a read operation according to an embodiment of the present disclosure.

In some examples, as shown in FIG. 6a, during the program operation, it is necessary to apply different voltages to a target word line and the plurality of word lines adjacent to the target word line, thereby reducing the effect of high electric field stress. However, for the read operation, since the voltage applied to the target word line during the read operation is much smaller than the voltage applied to the target word line during the program operation, the electric field effect is weak, and there is no need to apply the special voltage to the too many word lines adjacent to the target word line. Exemplarily, during the program operation, different voltages are applied to the target word line (WLn) and the upper 4 word lines (WLn−4 to WLn−1) and the lower 5 word lines (WLn+1 to WLn+5) adjacent to the target word line. That is, different bias voltages are needed to be individually applied to a total of 10 special word lines. The selected voltages here can be understood as the bias voltages that need to be applied to the special word lines individually. Therefore, there are a total of 10 selected voltages, and 10 selected voltage selection circuits are required. As shown in FIG. 6b, during the read operation, the target word line (WLm), the upper 1 word line (WLm−1) adjacent to the target word line, and the lower 1 word line (WLm+1) adjacent to the target word line need individually-applied voltage. The voltage of the upper 1 word line adjacent to the target word line and the voltage of the lower 1 word line adjacent to the target word line can be the same, that is, there are two different selected voltages. Therefore, 2 selected voltage selection circuits are required to provide 2 different selected voltages. Here, the upper word lines adjacent to the target word line and the lower word lines adjacent to the target word line can be understood with reference to FIG. 3b, and the upper word lines adjacent to the target word line can be understood as the word lines between the target word line and the bit line 316, and the lower word lines adjacent to the target word line can be understood as the word lines between the target word line and the source line 314.

Figure 7:
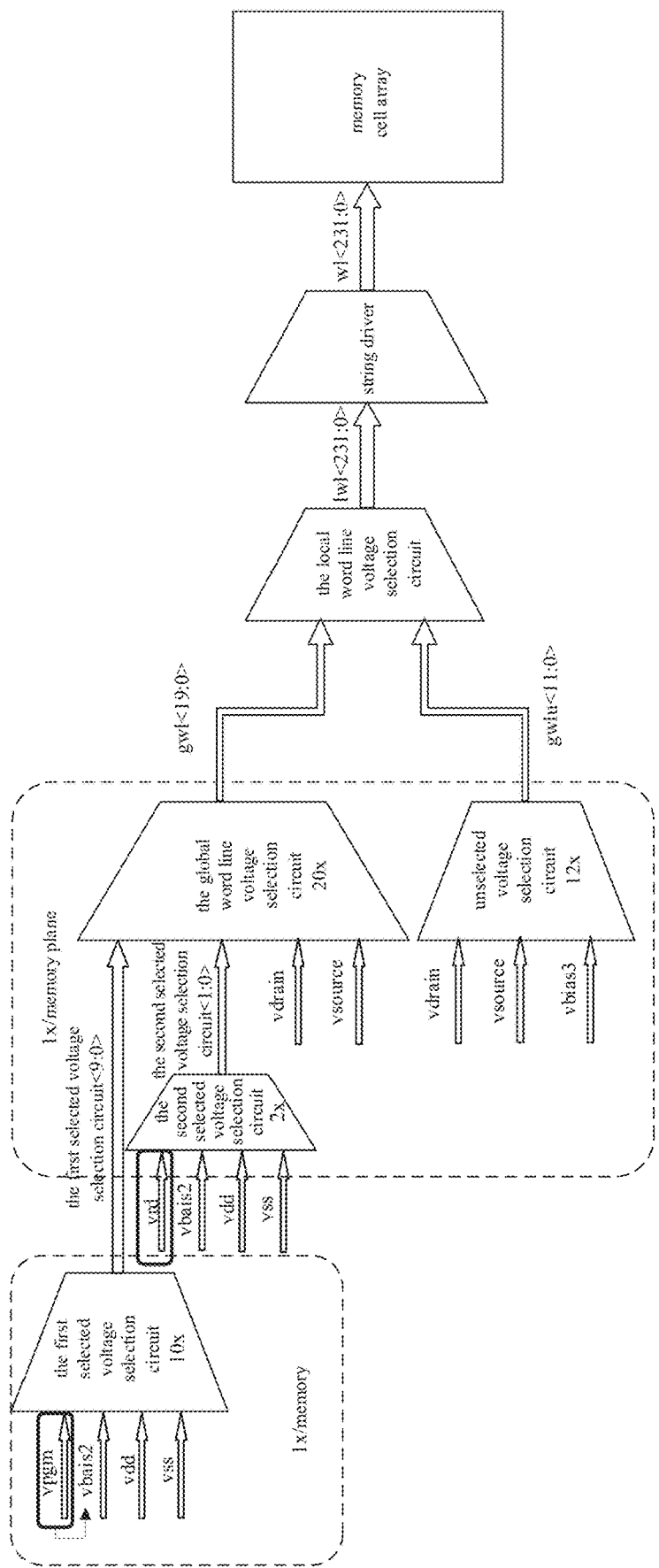
FIG. 7 is a first schematic structural diagram of peripheral circuits according to an embodiment of the disclosure.

FIG. 7 exemplarily shows a schematic structural diagram of peripheral circuits during a program operation and a read operation. As can be seen from FIG. 7, there are 10 first selected voltage selection circuits provided in the peripheral circuits for selecting voltage during the program operation. These 10 first selected voltage selection circuits are shared by 4 memory planes during the program operation. While during the read operation, there are two selected voltages, and each memory plane is configured with two second selected voltage selection circuits for selecting voltage.

It can be understood that, in the solution provided by the above embodiment, during the program operation, the first selected voltage selection circuits are used to provide 10 different selected voltages for the special 10 word lines. The number of the required first selected voltage selection circuits is 10 and the 10 first selected voltage selection circuits are shared by the plurality of memory planes. While during the read operation, in order to realize the asynchronous multi-plane independent read operations, the second selected voltage selection circuits are used to provide voltages for the special word lines on different memory planes. Here, the number of selected voltages is 2, and 2 second selected voltage selection circuits are required for each memory plane. For example, when the number of memory planes is 4, 8 second selected voltage selection circuits are required. That is, different selected voltage selection circuits are used in the read operation and the program operation. In total, at least 18 first selected voltage selection circuits and second selected voltage selection circuits need to be arranged in the peripheral circuits. In doing so, the number of the selected voltage selection circuits is larger, and the area of the peripheral circuits and the area of the memory device are larger.

Based on the above problems, another memory device is provided in an embodiment of the present disclosure. The memory device comprises a memory cell array and a peripheral circuit coupled to the memory cell array; the memory cell array includes a plurality of memory planes; the peripheral circuit includes a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane; the selected voltage selection circuits are configured to select a voltage from a plurality of selected voltages to output to the global word line voltage selection circuits; the global word line voltage selection circuits are configured to select a voltage from unselected voltages and the voltage output from the selected voltage selection circuits to output to the local word line voltage selection circuits; during a program operation, the plurality of memory planes share the plurality of selected voltage selection circuits; and during a read operation, each memory plane uses a part of the plurality of selected voltage selection circuits respectively to perform voltage selection.

Here, the fact that the plurality of selected voltage selection circuits correspond to the plurality of memory planes can be understood that there are various correspondences between the memory planes and the selected voltage selection circuits. During the program operation, the plurality of selected voltage selection circuits correspond to each memory plane in the plurality of memory planes; while during the read operation, different parts of the plurality of selected voltage selection circuits correspond to each memory plane of the plurality of memory planes respectively.

In some examples, the memory cell array and the peripheral circuits are provided on the same chip. In some other examples, the memory cell array is provided on an array chip, and the peripheral circuits are provided on different chips, which may be chips implemented using complementary metal oxide semiconductor (CMOS) technology and called as CMOS chip. The array chip and the CMOS chip can be electrically coupled together using a bonding process. In some examples, the CMOS chip may be coupled with multiple array chips.

It can be understood that the selected voltages and unselected voltages here can be generated by the voltage generator shown in FIG. 5. After a plurality of different voltages are provided by the voltage generator, the selected voltage selection circuits, the global word line voltage selection circuits, the local word line voltage selection circuits and the following unselected voltage selection circuits are all configured to select voltage, and finally different voltages generated by the voltage generator are applied to different word lines in the memory plane respectively, so as to realize the program and read operations for the plurality of memory planes.

It can be understood that, in the above-mentioned embodiments of the present disclosure, during the program operation and the read operation, the selected voltage selection circuits are shared. That is, during the read operation, the selected voltage selection circuits during the program operation are multiplexed, and the selected voltage selection circuits during the read operation are not individually set, so that the number of selected voltage selection circuits is small, the area of the peripheral circuits is smaller, and the area of the memory device is reduced.

In the following, it still takes the situation to make an illustration, in which it is necessary to apply different voltages to 10 special word lines during the program operation. There are a total of 10 selected voltages, 4 memory planes need a total of 10 selected voltage selection circuits, and it is necessary to apply two different voltages to 3 special word lines during the read operation, there are a total of 2 unselected voltages, each memory plane needs 2 selected voltage selection circuits, and 4 memory planes need a total of 8 selected voltage selection circuits.

Figure 8:
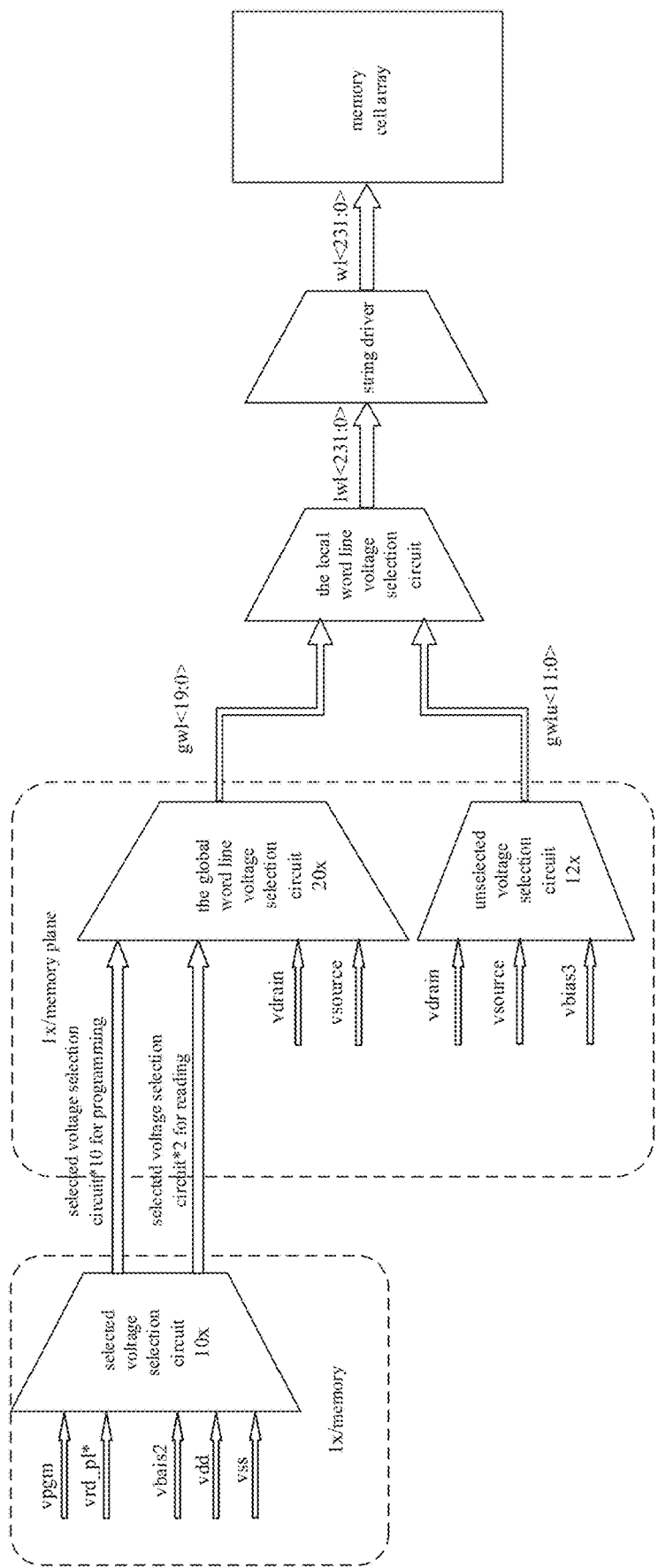
FIG. 8 is a second schematic structural diagram of peripheral circuits according to an embodiment of the disclosure.

FIG. 8 exemplarily shows a schematic structural diagram of peripheral circuits during a program operation and a read operation. As can be seen from FIG. 8, 10 selected voltage selection circuits are provided in the peripheral circuits for selecting voltage during the program operation, and these 10 selected voltage selection circuits are shared by 4 memory planes during the program operation. While during the read operation, there are 2 selected voltages, and each memory plane is configured with 2 selected voltage selection circuits for selecting voltage.

During the program operation, since 4 memory planes share 10 selected voltage selection circuits, a total of 10 selected voltage selection circuits are required. While during the read operation, if the read operation is performed with the asynchronous multi-plane independent read method, each memory plane needs an individual selected voltage selection circuit to select the voltage. Since each memory plane needs to provide 2 selected voltages, a total of 8 selected voltage selection circuits are required to select the voltage. The selected voltage selection circuits during the program operation are multiplexed for the reading, and it is not necessary to individually set 8 selected voltage selection circuits dedicated to the read operation. Therefore, 8 selected voltage selection circuits may be reduced, thereby reducing the area of peripheral circuits.

Figure 9A:
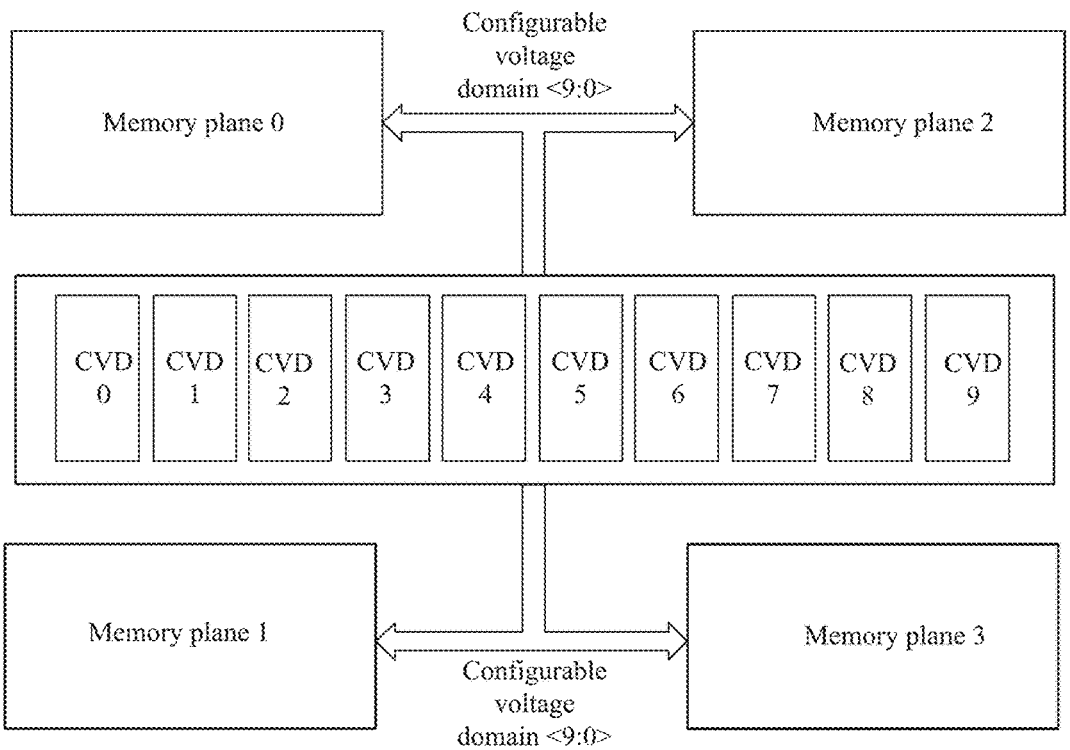
FIG. 9a is a schematic diagram illustrating the correspondence between a plurality of memory planes and selected voltage selection circuits during a program operation according to an embodiment of the present disclosure.
Figure 9B:
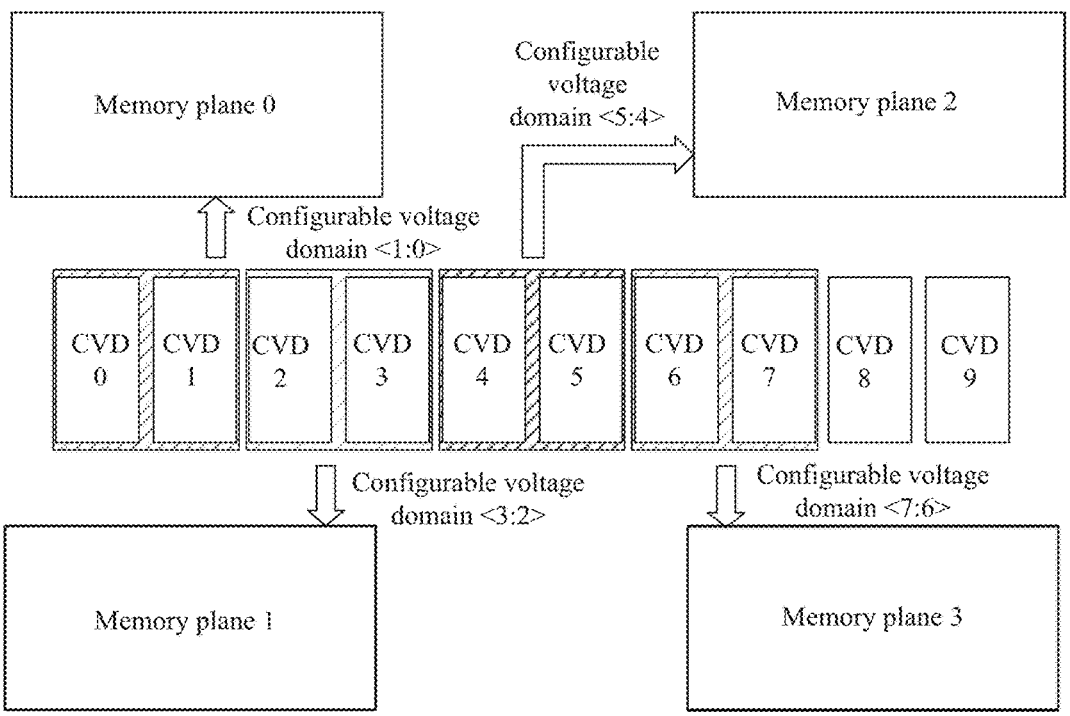
FIG. 9b is a first schematic diagram illustrating the correspondence between a plurality of memory planes and selected voltage selection circuits during a read operation according to an embodiment of the present disclosure.

FIG. 9a shows the correspondence between a plurality of memory planes and selected voltage selection circuits during a program operation; and FIG. 9b shows the correspondence between a plurality of memory planes and selected voltage selection circuits during a read operation. It should be noted that FIG. 9a and FIG. 9b are only exemplary, and are not used to limit the correspondence between the memory planes and the selected voltage selection circuits in the embodiment of the present disclosure. As can be seen from FIG. 9a and FIG. 9b, 4 memory planes share 10 selected voltage selection circuits (Configurable Voltage Domain (CVD) 0-Configurable Voltage Domain (CVD) 9) during the program operation; while each memory plane corresponds to different selected voltage selection circuit respectively during the read operation, and the selected voltage selection circuits used during the read operation are the selected voltage selection circuits used during the program operation. In some implementations, it may be that the memory plane 0 corresponds to configurable voltage domain 0-configurable voltage domain 1, the memory plane 1 corresponds to configurable voltage domain 2-configurable voltage domain 3, the memory plane 2 corresponds to configurable voltage domain 4-configurable voltage domain 5, the memory plane 3 corresponds to configurable voltage domain 6-configurable voltage domain 7, and the remaining two selected voltage selection circuits can be used for backup.

In some embodiments, during the program operation, the number of selected voltages corresponding to a plurality of memory planes is a, and the number of the selected voltage selection circuits corresponding to the plurality of memory planes is at least a; and during the read operation, the number of selected voltages corresponding to each memory plane is b, and the number of the selected voltage selection circuits corresponding to each memory plane is at least b; the number of the memory planes is c, and the relationship among a, b, and c is: a≥b*c; wherein, both a and b are positive integers greater than 0, and c is a positive integer greater than 1.

Here, during the program operation, the selected voltages corresponding to the plurality of memory planes are the different voltages applied to the target word line and the word lines adjacent to the target word line. The fact that the number of selected voltage selection circuits is at least a can be understood that the number of selected voltage selection circuits may be equal to or greater than the number of selected voltages. When the number of selected voltage selection circuits is equal to the number of selected voltages, each selected voltage selection circuit selects one selected voltage. When the number of selected voltage selection circuits is greater than the number of selected voltages, any a selected voltage selection circuits among the plurality of selected voltage selection circuits are configured to select voltage, and the remaining selected voltage selection circuits can be used for backup. During the read operation, the selected voltages corresponding to each memory plane are different. The understanding for the selected voltages and the selected voltage selection circuits may be referred to the previous explanation of the selected voltages and the selected voltage selection circuits during the program operation, which will not be repeated here.

Here, a≥b*c can be understood as follows. Since the selected voltage selection circuits are shared during the program operation and the read operation, and a total of b*c selected voltage selection circuits are required during the read operation, the number of the selected voltage selection circuits during the program operation is greater than or equal to the total number of the selected voltage selection circuits during the read operation, in order that each memory plane may be assigned with b selected voltage selection circuits for selecting voltage during the read operation.

Figure 10:
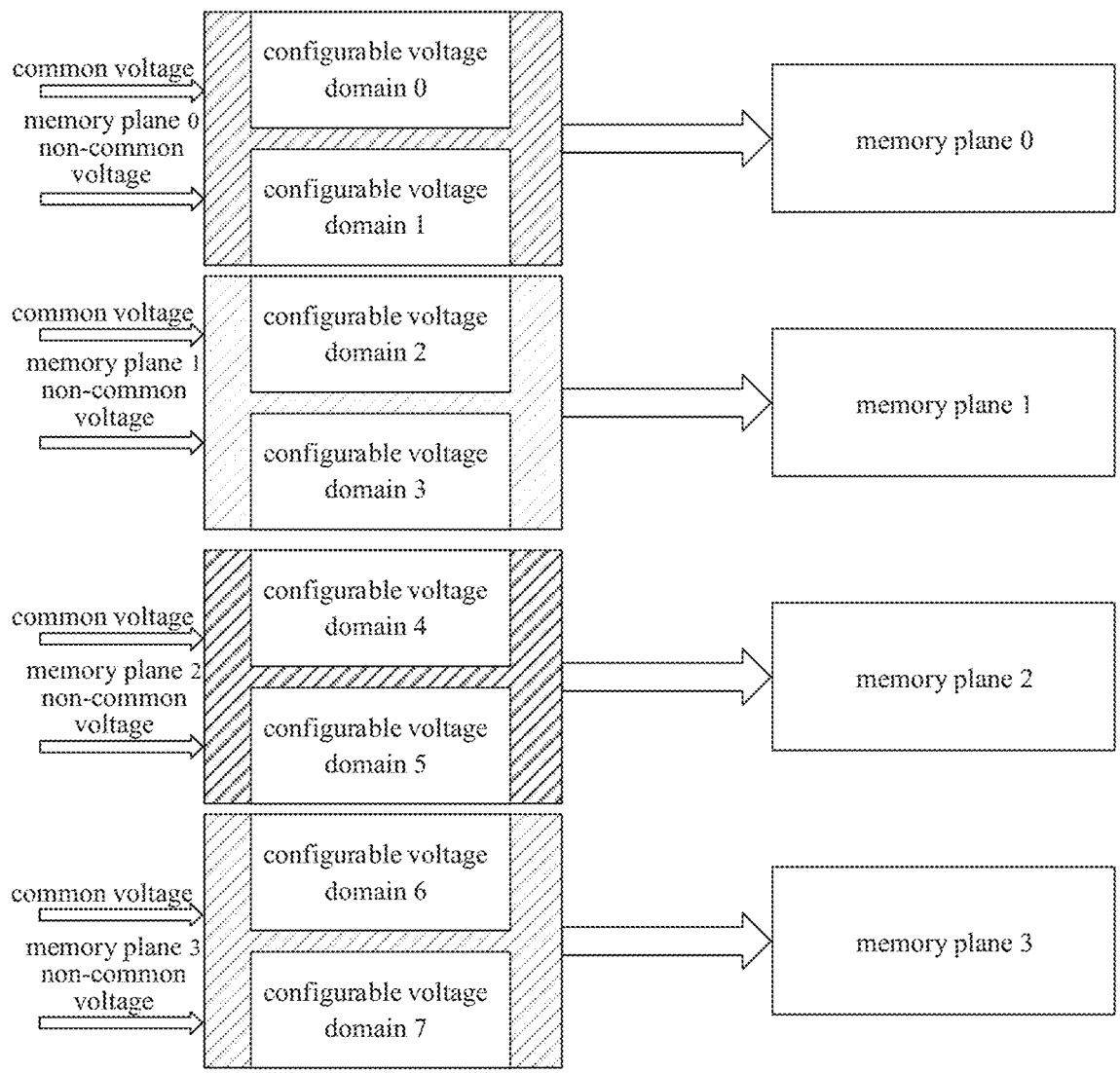
FIG. 10 is a second schematic diagram illustrating the correspondence between a plurality of memory planes and selected voltage selection circuits during a read operation according to an embodiment of the present disclosure.

In some examples, as shown in FIG. 10, in order to realize the asynchronous multi-plane independent read function, some non-common voltages related to asynchronous multi-plane independent read are independently provided for each memory plane, while the common voltages that support any operation (for example, common logic voltages, common power supply voltages) are shared by the 4 memory planes, so that the asynchronous multi-plane independent read operations can be realized while reducing the area of the analog circuits. The logic control signals are provided independently for different groups of configurable voltage domains during asynchronous multi-plane independent read operations. Therefore, the voltage sources can be connected asynchronously to the configurable voltage domains.

Figure 11:
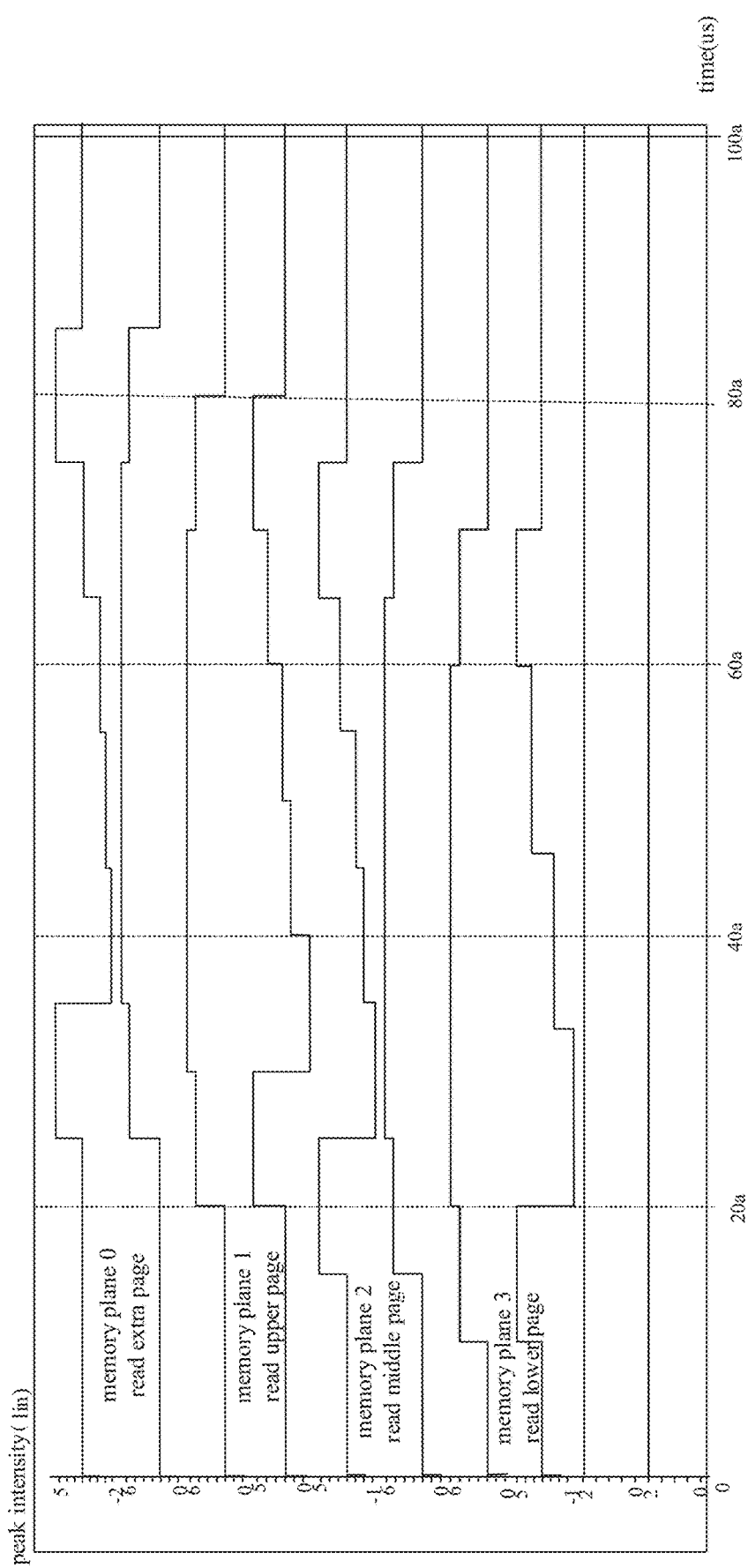
FIG. 11 is a schematic diagram of a simulation waveform of an asynchronous multi-plane independent read operation according to an embodiment of the present disclosure.

FIG. 11 shows a schematic diagram of a simulation waveform of an asynchronous multi-plane independent read operation. It can be seen from FIG. 11 that during the asynchronous multi-plane independent read operation, the selected voltage selection circuits assigned to different memory planes can asynchronously perform voltage selection operations.

In some examples, the local word lines may be divided into multiple groups, and each group includes 20 local word lines (for a memory device in which the number of local word lines corresponding to each memory plane is 232, the number of local word lines included in some groups is less than 20). Only the group including the target local word line and the special local word lines adjacent to the target local word line is supplied with voltages using the global word line voltage selection circuits, while the local word lines of other groups are all supplied with voltages using the unselected voltage selection circuits. In the solutions proposed in FIG. 7 and FIG. 8, each memory plane corresponds to a group of unselected voltage selection circuits, and each group of unselected voltage selection circuits includes 12 unselected voltage selection circuits for selecting the unselected voltages. In some examples, for the read operations, except for the target word line and the upper and lower two word lines adjacent to the target word line, the voltages that need to be applied on the other word lines are the same as Vbais1. Therefore, in the asynchronous multi-plane independent read operations, it needs not too many unselected voltage selection circuits to realize the asynchronous multi-plane independent read operations.

In order to further reduce the area of the peripheral circuits, the following solutions are proposed from the aspect of the unselected voltage selection circuits.

In some embodiments, the peripheral circuit further comprises: a plurality of unselected voltage selection circuits corresponding to the plurality of memory planes; each unselected voltage selection circuit corresponds to a plurality of local word line voltage selection circuits on one memory plane, each local word line voltage selection circuit corresponds to one unselected voltage selection circuit; each unselected voltage selection circuit is configured to select a voltage from at least one unselected voltage to output to the local word line voltage selection circuits; during a program operation, the plurality of memory planes share the plurality of unselected voltage selection circuits; during a read operation, each memory plane uses a part of the plurality of unselected voltage selection circuits respectively to perform voltage selection.

Here, for the plurality of unselected voltage selection circuits corresponding to the plurality of memory planes, it can be understood that there are various correspondences between the memory planes and the unselected voltage selection circuits. During the program operation, the plurality of unselected voltage selection circuits corresponds to each of the plurality of memory planes, while during the read operation, the different parts of the plurality of unselected voltage selection circuits correspond to each of the plurality of memory planes respectively.

In some embodiments, during the program operation, the number of unselected voltages corresponding to the plurality of memory planes is d, and the number of unselected voltage selection circuits corresponding to the plurality of memory planes is at least d; during the read operation, the number of unselected voltages corresponding to each memory plane is e, and the number of unselected voltage selection circuits corresponding to each memory plane is at least e; the number of the memory planes is c, and the relationship among c, d, and e is: d≥e*c; wherein, both d and e are positive integers greater than 0, and c is a positive integer greater than 1.

Here, during the program operation, the unselected voltages corresponding to the plurality of memory planes are the voltages applied to the word lines other than the special word lines (including the target word line and the plurality of word lines adjacent to the target word line). The fact that the number of unselected voltage selection circuits is at least d can be understood that the number of unselected voltage selection circuits may be equal to or greater than the number of unselected voltages. When the number of unselected voltage selection circuits is equal to the number of unselected voltages, each unselected voltage selection circuit selects one unselected voltage. When the number of unselected voltage selection circuits is greater than the number of unselected voltages, any d unselected voltage selection circuits among the plurality of selected voltage selection circuits are configured to select voltage, and the remaining unselected voltage selection circuits can be used for backup. During the read operation, the unselected voltages corresponding to each memory plane are different. The understanding for the unselected voltages and the unselected voltage selection circuits may be referred to the previous explanation of the selected voltages and the selected voltage selection circuits during the program operation, which will not be repeated here.

Here, d≥e*c can be understood as follows, since the unselected voltage selection circuits are shared during the program operation and the read operation, and a total of e*c unselected voltage selection circuits are required during the read operation, the number of the unselected voltage selection circuits during the program operation is greater than or equal to the total number of the unselected voltage selection circuits required during the read operation, in order that each memory plane may be assigned with e unselected voltage selection circuits for selecting voltage during the read operation.

In the solutions proposed in the embodiments corresponding to FIG. 7 and FIG. 8, for the program and erase operations, different unselected voltage selection circuits may need to select different unselected voltages. But for asynchronous multi-plane independent read operations, the unselected voltage selection circuits corresponding to one memory plane select the same unselected voltage, and only one unselected voltage selection circuit is sufficient for each memory plane. Therefore, only one group of unselected voltage selection circuits needs to be reserved, instead of four groups of unselected voltage selection circuits shared by four memory planes. During the program operation, the local word lines of the four memory planes share the same group of unselected voltage selection circuits. During the read operation, if the number of unselected voltage selection circuits is greater than the number of memory planes, the plurality of unselected voltage selection circuits may be divided into multiple parts, and the number of parts of unselected voltage selection circuits may be the same as the number of memory planes. Then each part of the unselected voltage selection circuits is assigned to one memory plane respectively.

Figure 12:
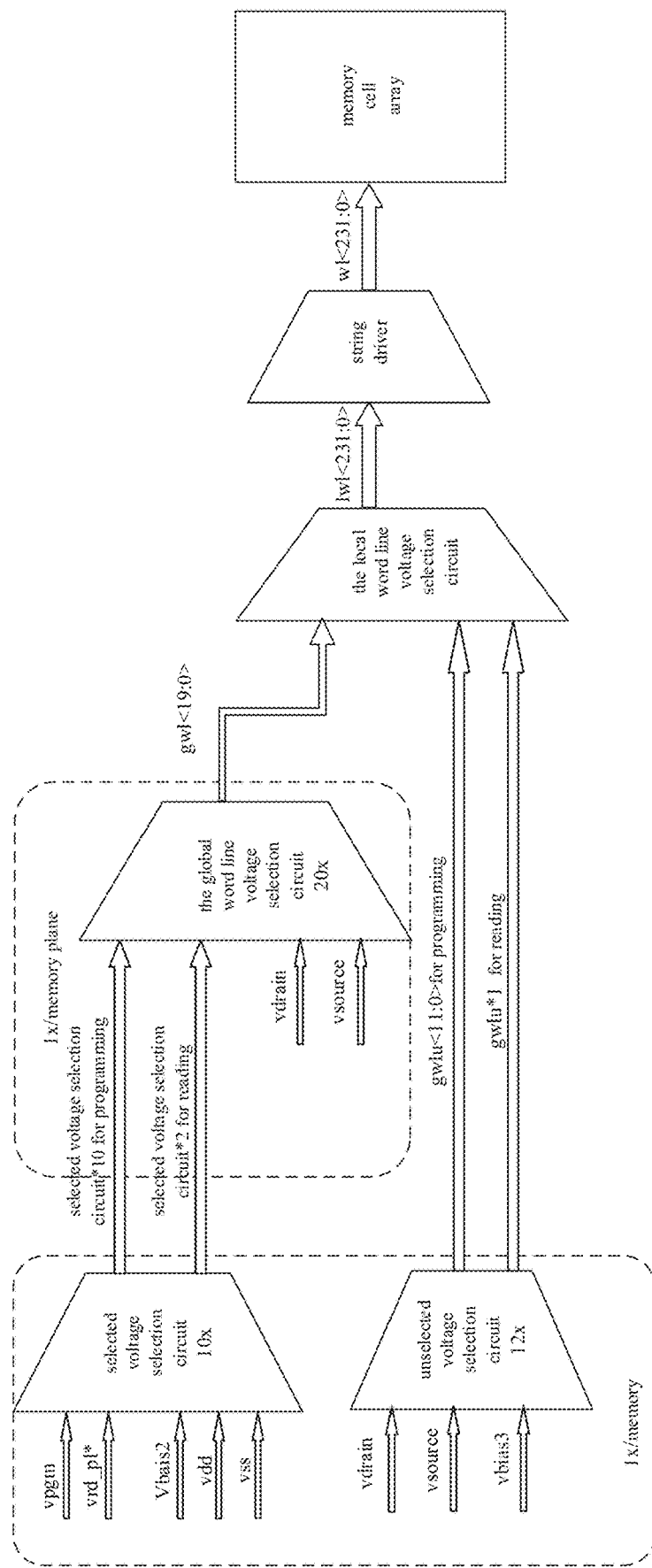
FIG. 12 is a third schematic structural diagram of peripheral circuits according to an embodiment of the disclosure.

FIG. 12 shows a schematic structural diagram of another peripheral circuit. As can be seen from FIG. 12, the plurality of memory planes share corresponding groups of unselected voltage selection circuits, and each group of unselected voltage selection circuits includes 12 unselected voltages selection circuits. During the program operation, the plurality of memory planes share 12 unselected voltage selection circuits, while during the read operation, the unselected voltage selection circuits used for the program operation are multiplexed in the read operation, and each memory plane may correspond to one unselected voltage selection circuit. That is, each memory device is configured with 12 unselected voltage selection circuits. However, in the solutions proposed in FIG. 7 and FIG. 8, each memory plane is configured with a group of unselected voltage selection circuits. Four memory planes need to be configured with a total of 4 groups of unselected voltage selection circuits, so a total of 48 unselected voltage selection circuits are required. Therefore, the number of unselected voltage selection circuits in the solution shown in FIG. 12 is greatly reduced compared with the solutions shown in FIGS. 7 and 8, thereby the area of peripheral circuits can be reduced.

Figure 13A:
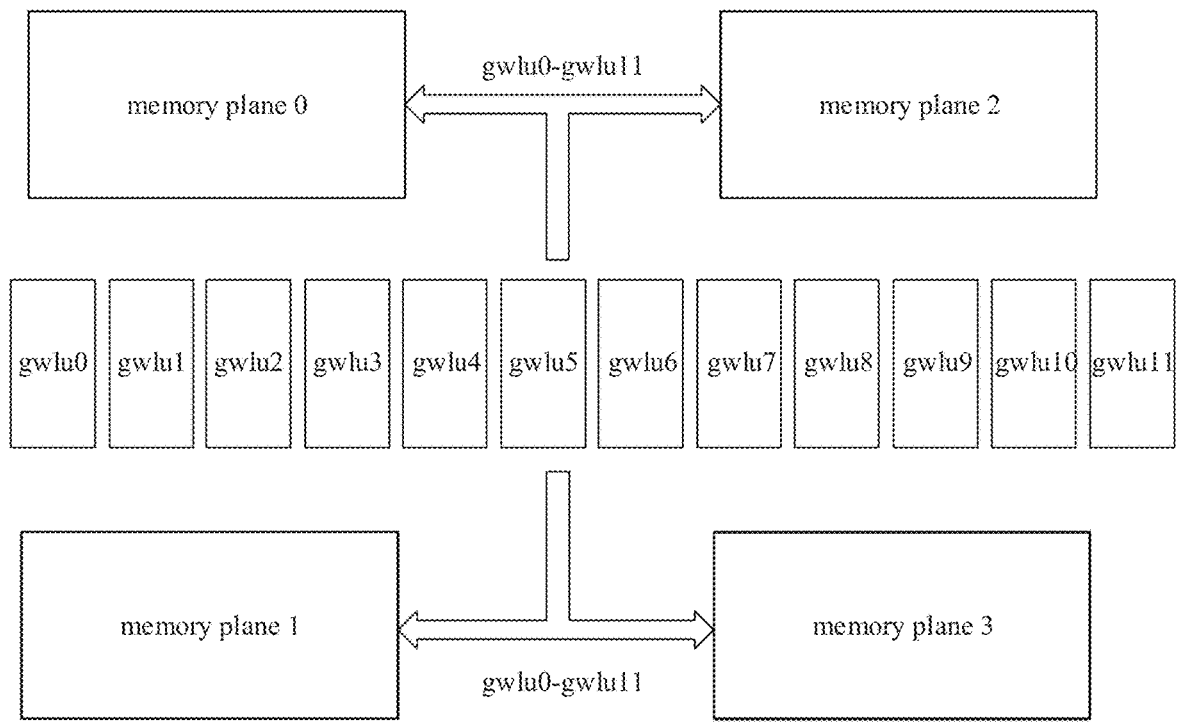
FIG. 13a is a schematic diagram illustrating the correspondence between a plurality of memory planes and unselected voltage selection circuits during a program operation according to an embodiment of the present disclosure.
Figure 13B:
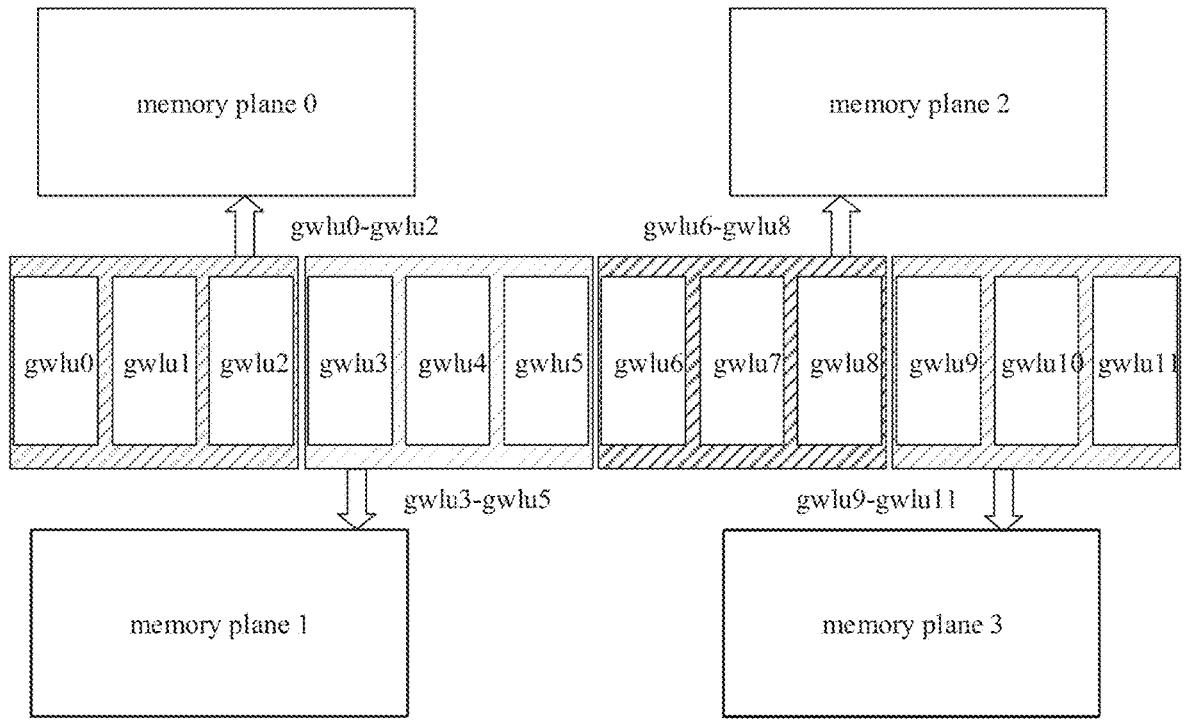
FIG. 13b is a schematic diagram illustrating the corresponding between a plurality of memory planes and unselected voltage selection circuits during a read operation according to an embodiment of the present disclosure.

FIG. 13a exemplarily shows a schematic diagram of the correspondence between a plurality of unselected voltage selection circuits and memory planes during the program operation; FIG. 13b exemplarily shows a schematic diagram of the correspondence between a plurality of unselected voltage selection circuits and memory planes during the read operation. As can be seen from FIG. 13a, during the program and erase operations, 4 memory planes share 12 unselected voltage selection circuits (gwlu0-gwlu11). As can be seen from FIG. 13b, during the read operation, each of the 4 memory planes corresponds to three unselected voltage selection circuits, and the unselected voltage selection circuits corresponding to different memory planes are different. Here, during the read operation, three unselected voltage selection circuits are assigned to each memory plane in order to make full use of existing circuits and reduce the area of each unselected voltage selection circuit.

In some embodiments, the peripheral circuit further comprises: a plurality of global word lines corresponding to the global word line voltage selection circuits one-to-one; during a program operation, the number of the selected voltage selection circuits corresponding to the plurality of memory planes is a, and the adjacent a global word lines on each memory plane correspond to different selected voltage selection circuits; during a read operation, the global word lines on different memory planes correspond to different selected voltage selection circuits, the number of selected voltage selection circuits corresponding to each memory plane is b, and the adjacent b global word lines on each memory plane correspond to different selected voltage selection circuits.

In some embodiments, each of the memory planes comprises a plurality of word lines; the peripheral circuit further includes a plurality of global word lines corresponding to the global word line voltage selection circuits one-to-one, and a plurality of local word lines corresponding to the local word line voltage selection circuits one-to-one; wherein, each of the global word lines corresponds to the plurality of local word lines; each of the local word lines corresponds to one global word line, and each of the local word lines corresponds to one word line; the global word line voltage selection circuits output a voltage to the local word line voltage selection circuits through the global word lines; the local word line voltage selection circuits output a voltage to the corresponding word lines through the local word lines.

In some examples, the global word line voltage selection circuits are used to select a voltage from unselected voltages and the voltage output from the selected voltage selection circuits to output to the local word line voltage selection circuits through one global word line; the local word line voltage selection circuits are used to select a voltage from voltages output by the corresponding global word line voltage selection circuits and the voltage output by the unselected voltage selection circuits to output to the corresponding word lines through one local word line.

In some examples, for the 3D NAND in which there are 4 memory planes (Plane0-Plane3), each memory plane in the peripheral circuits corresponds to 232 local word lines, each memory plane corresponds to 20 global word lines, 4 memory planes correspond to 10 selected voltages during the program operation, 4 memory planes correspond to 12 unselected voltages during the program operation, each memory plane corresponds to 2 selected voltages during the read operation, and each memory plane corresponds to 1 unselected voltage during the read operation, Table 1 shows the correspondence of the selected voltage selection circuits (configurable voltage domain 0-configurable voltage domain 7), the global word line voltage selection circuits (gwl0-gwl19), unselected voltage selection circuits (gwlu0-gwlu11), and local word lines (LWL0-LWL231) corresponding to one memory plane in the peripheral circuit provided according to an embodiment of the disclosure. It should be noted that, the correspondence of each pan in Table 1 is just an example, and is not used to limit the correspondence between each part in the memory device in the embodiment of the present disclosure.

TABLE 1

| program | read | | | | | |
|---|---|---|---|---|---|---|
| Plane0-Plane3 | Plane0 | Plane1 | Plane2 | Plane3 | | |
| configurable voltage domain 0 | configurable voltage domain 0 | configurable voltage domain 2 | configurable voltage domain 4 | configurable voltage domain 6 | GWL0 | LWL0 |
| configurable voltage domain 1 | configurable voltage domain 1 | configurable voltage domain 3 | configurable voltage domain 5 | configurable voltage domain 7 | GWL1 | LWL1 |
| configurable voltage domain 2 | configurable voltage domain 0 | configurable voltage domain 2 | configurable voltage domain 4 | configurable voltage domain 6 | GWL2 | LWL2 |
| configurable voltage domain 3 | configurable voltage domain 1 | configurable voltage domain 3 | configurable voltage domain 5 | configurable voltage domain 7 | GWL3 | LWL3 |
| configurable voltage domain 4 | configurable voltage domain 0 | configurable voltage domain 2 | configurable voltage domain 4 | configurable voltage domain 6 | GWL4 | LWL4 |
| configurable voltage domain 5 | configurable voltage domain 1 | configurable voltage domain 3 | configurable voltage domain 5 | configurable voltage domain 7 | GWL5 | LWL5 |
| configurable voltage domain 6 | configurable voltage domain 0 | configurable voltage domain 2 | configurable voltage domain 4 | configurable voltage domain 6 | GWL6 | LWL6 |
| configurable voltage domain 7 | configurable voltage domain 1 | configurable voltage domain 3 | configurable voltage domain 5 | configurable voltage domain 7 | GWL7 | LWL7 |
| configurable voltage domain 8 | configurable voltage domain 0 | configurable voltage domain 2 | configurable voltage domain 4 | configurable voltage domain 6 | GWL8 | LWL8 |
| configurable voltage domain 9 | configurable voltage domain 1 | configurable voltage domain 3 | configurable voltage domain 5 | configurable voltage domain 7 | GWL9 | LWL9 |
| configurable voltage domain 0 | configurable voltage domain 0 | configurable voltage domain 2 | configurable voltage domain 4 | configurable voltage domain 6 | GWL10 | LWL10 |
| configurable voltage domain 1 | configurable voltage domain 1 | configurable voltage domain 3 | configurable voltage domain 5 | configurable voltage domain 7 | GWL11 | LWL11 |
| configurable voltage domain 2 | configurable voltage domain 0 | configurable voltage domain 2 | configurable voltage domain 4 | configurable voltage domain 6 | GWL12 | LWL12 |
| configurable voltage domain 3 | configurable voltage domain 1 | configurable voltage domain 3 | configurable voltage domain 5 | configurable voltage domain 7 | GWL13 | LWL13 |
| configurable voltage domain 4 | configurable voltage domain 0 | configurable voltage domain 2 | configurable voltage domain 4 | configurable voltage domain 6 | GWL14 | LWL14 |
| configurable voltage domain 5 | configurable voltage domain 1 | configurable voltage domain 3 | configurable voltage domain 5 | configurable voltage domain 7 | GWL15 | LWL15 |
| configurable voltage domain 6 | configurable voltage domain 0 | configurable voltage domain 2 | configurable voltage domain 4 | configurable voltage domain 6 | GWL16 | LWL16 |
| configurable voltage domain 7 | configurable voltage domain 1 | configurable voltage domain 3 | configurable voltage domain 5 | configurable voltage domain 7 | GWL17 | LWL17 |
| configurable voltage domain 8 | configurable voltage domain 0 | configurable voltage domain 2 | configurable voltage domain 4 | configurable voltage domain 6 | GWL18 | LWL18 |
| configurable voltage domain 9 | configurable voltage domain 1 | configurable voltage domain 3 | configurable voltage domain 5 | configurable voltage domain 7 | GWL19 | LWL19 |
| configurable voltage domain 0 | configurable voltage domain 0 | configurable voltage domain 2 | configurable voltage domain 4 | configurable voltage domain 6 | GWL0 | LWL20 |
| configurable voltage domain 1 | configurable voltage domain 1 | configurable voltage domain 3 | configurable voltage domain 5 | configurable voltage domain 7 | GWL1 | LWL21 |
| configurable voltage domain 2 | configurable voltage domain 0 | configurable voltage domain 2 | configurable voltage domain 4 | configurable voltage domain 6 | GWL2 | LWL22 |
| configurable voltage domain 3 | configurable voltage domain 1 | configurable voltage domain 3 | configurable voltage domain 5 | configurable voltage domain 7 | GWL3 | LWL23 |
| configurable voltage domain 4 | configurable voltage domain 0 | configurable voltage domain 2 | configurable voltage domain 4 | configurable voltage domain 6 | GWL4 | LWL24 |
| configurable voltage domain 5 | configurable voltage domain 1 | configurable voltage domain 3 | configurable voltage domain 5 | configurable voltage domain 7 | GWL5 | LWL25 |
| configurable voltage domain 6 | configurable voltage domain 0 | configurable voltage domain 2 | configurable voltage domain 4 | configurable voltage domain 6 | GWL6 | LWL26 |
| configurable voltage domain 7 | configurable voltage domain 1 | configurable voltage domain 3 | configurable voltage domain 5 | configurable voltage domain 7 | GWL7 | LWL27 |
| configurable voltage domain 8 | configurable voltage domain 0 | configurable voltage domain 2 | configurable voltage domain 4 | configurable voltage domain 6 | GWL8 | LWL28 |
| configurable voltage domain 9 | configurable voltage domain 1 | configurable voltage domain 3 | configurable voltage domain 5 | configurable voltage domain 7 | GWL9 | LWL29 |
| configurable voltage domain 0 | configurable voltage domain 0 | configurable voltage domain 2 | configurable voltage domain 4 | configurable voltage domain 6 | GWL10 | LWL30 |
| configurable voltage domain 1 | configurable voltage domain 1 | configurable voltage domain 3 | configurable voltage domain 5 | configurable voltage domain 7 | GWL11 | LWL31 |
| configurable voltage domain 2 | configurable voltage domain 0 | configurable voltage domain 2 | configurable voltage domain 4 | configurable voltage domain 6 | GWL12 | LWL32 |
| configurable voltage domain 3 | configurable voltage domain 1 | configurable voltage domain 3 | configurable voltage domain 5 | configurable voltage domain 7 | GWL13 | LWL33 |
| configurable voltage domain 4 | configurable voltage domain 0 | configurable voltage domain 2 | configurable voltage domain 4 | configurable voltage domain 6 | GWL14 | LWL34 |
| configurable voltage domain 5 | configurable voltage domain 1 | configurable voltage domain 3 | configurable voltage domain 5 | configurable voltage domain 7 | GWL15 | LWL35 |
| configurable voltage domain 6 | configurable voltage domain 0 | configurable voltage domain 2 | configurable voltage domain 4 | configurable voltage domain 6 | GWL16 | LWL36 |
| configurable voltage domain 7 | configurable voltage domain 1 | configurable voltage domain 3 | configurable voltage domain 5 | configurable voltage domain 7 | GWL17 | LWL37 |

TABLE 1-continued

| | | | | | | |
|---|---|---|---|---|---|---|
| configurable voltage domain 8 | configurable voltage domain 0 | configurable voltage domain 2 | configurable voltage domain 4 | configurable voltage domain 6 | GWL18 | LWL38 |
| configurable voltage domain 9 | configurable voltage domain 1 | configurable voltage domain 3 | configurable voltage domain 5 | configurable voltage domain 7 | GWL19 | LWL39 |
| configurable voltage domain 0 | configurable voltage domain 0 | configurable voltage domain 2 | configurable voltage domain 4 | configurable voltage domain 6 | GWL0 | LWL40 |
| configurable voltage domain 1 | configurable voltage domain 1 | configurable voltage domain 3 | configurable voltage domain 5 | configurable voltage domain 7 | GWL1 | LWL41 |
| configurable voltage domain 2 | configurable voltage domain 0 | configurable voltage domain 2 | configurable voltage domain 4 | configurable voltage domain 6 | GWL2 | LWL42 |
| configurable voltage domain 3 | configurable voltage domain 1 | configurable voltage domain 3 | configurable voltage domain 5 | configurable voltage domain 7 | GWL3 | LWL43 |
| configurable voltage domain 4 | configurable voltage domain 0 | configurable voltage domain 2 | configurable voltage domain 4 | configurable voltage domain 6 | GWL4 | LWL44 |
| configurable voltage domain 5 | configurable voltage domain 1 | configurable voltage domain 3 | configurable voltage domain 5 | configurable voltage domain 7 | GWL5 | LWL45 |
| configurable voltage domain 6 | configurable voltage domain 0 | configurable voltage domain 2 | configurable voltage domain 4 | configurable voltage domain 6 | GWL6 | LWL46 |
| configurable voltage domain 7 | configurable voltage domain 1 | configurable voltage domain 3 | configurable voltage domain 5 | configurable voltage domain 7 | GWL7 | LWL47 |
| configurable voltage domain 8 | configurable voltage domain 0 | configurable voltage domain 2 | configurable voltage domain 4 | configurable voltage domain 6 | GWL8 | LWL48 |
| configurable voltage domain 9 | configurable voltage domain 1 | configurable voltage domain 3 | configurable voltage domain 5 | configurable voltage domain 7 | GWL9 | LWL49 |
| configurable voltage domain 0 | configurable voltage domain 0 | configurable voltage domain 2 | configurable voltage domain 4 | configurable voltage domain 6 | GWL10 | LWL50 |
| configurable voltage domain 1 | configurable voltage domain 1 | configurable voltage domain 3 | configurable voltage domain 5 | configurable voltage domain 7 | GWL11 | LWL51 |
| configurable voltage domain 2 | configurable voltage domain 0 | configurable voltage domain 2 | configurable voltage domain 4 | configurable voltage domain 6 | GWL12 | LWL52 |
| configurable voltage domain 3 | configurable voltage domain 1 | configurable voltage domain 3 | configurable voltage domain 5 | configurable voltage domain 7 | GWL13 | LWL53 |
| configurable voltage domain 4 | configurable voltage domain 0 | configurable voltage domain 2 | configurable voltage domain 4 | configurable voltage domain 6 | GWL14 | LWL54 |
| configurable voltage domain 5 | configurable voltage domain 1 | configurable voltage domain 3 | configurable voltage domain 5 | configurable voltage domain 7 | GWL15 | LWL55 |
| configurable voltage domain 6 | configurable voltage domain 0 | configurable voltage domain 2 | configurable voltage domain 4 | configurable voltage domain 6 | GWL16 | LWL56 |
| configurable voltage domain 7 | configurable voltage domain 1 | configurable voltage domain 3 | configurable voltage domain 5 | configurable voltage domain 7 | GWL17 | LWL57 |
| configurable voltage domain 8 | configurable voltage domain 0 | configurable voltage domain 2 | configurable voltage domain 4 | configurable voltage domain 6 | GWL18 | LWL58 |
| configurable voltage domain 9 | configurable voltage domain 1 | configurable voltage domain 3 | configurable voltage domain 5 | configurable voltage domain 7 | GWL19 | LWL59 |
| configurable voltage domain 0 | configurable voltage domain 0 | configurable voltage domain 2 | configurable voltage domain 4 | configurable voltage domain 6 | GWL0 | LWL60 |
| configurable voltage domain 1 | configurable voltage domain 1 | configurable voltage domain 3 | configurable voltage domain 5 | configurable voltage domain 7 | GWL1 | LWL61 |
| configurable voltage domain 2 | configurable voltage domain 0 | configurable voltage domain 2 | configurable voltage domain 4 | configurable voltage domain 6 | GWL2 | LWL62 |
| configurable voltage domain 3 | configurable voltage domain 1 | configurable voltage domain 3 | configurable voltage domain 5 | configurable voltage domain 7 | GWL3 | LWL63 |
| configurable voltage domain 4 | configurable voltage domain 0 | configurable voltage domain 2 | configurable voltage domain 4 | configurable voltage domain 6 | GWL4 | LWL64 |
| configurable voltage domain 5 | configurable voltage domain 1 | configurable voltage domain 3 | configurable voltage domain 5 | configurable voltage domain 7 | GWL5 | LWL65 |
| configurable voltage domain 6 | configurable voltage domain 0 | configurable voltage domain 2 | configurable voltage domain 4 | configurable voltage domain 6 | GWL6 | LWL66 |
| configurable voltage domain 7 | configurable voltage domain 1 | configurable voltage domain 3 | configurable voltage domain 5 | configurable voltage domain 7 | GWL7 | LWL67 |
| configurable voltage domain 8 | configurable voltage domain 0 | configurable voltage domain 2 | configurable voltage domain 4 | configurable voltage domain 6 | GWL8 | LWL68 |
| configurable voltage domain 9 | configurable voltage domain 1 | configurable voltage domain 3 | configurable voltage domain 5 | configurable voltage domain 7 | GWL9 | LWL69 |
| configurable voltage domain 0 | configurable voltage domain 0 | configurable voltage domain 2 | configurable voltage domain 4 | configurable voltage domain 6 | GWL10 | LWL70 |
| configurable voltage domain 1 | configurable voltage domain 1 | configurable voltage domain 3 | configurable voltage domain 5 | configurable voltage domain 7 | GWL11 | LWL71 |
| configurable voltage domain 2 | configurable voltage domain 0 | configurable voltage domain 2 | configurable voltage domain 4 | configurable voltage domain 6 | GWL12 | LWL72 |
| configurable voltage domain 3 | configurable voltage domain 1 | configurable voltage domain 3 | configurable voltage domain 5 | configurable voltage domain 7 | GWL13 | LWL73 |
| configurable voltage domain 4 | configurable voltage domain 0 | configurable voltage domain 2 | configurable voltage domain 4 | configurable voltage domain 6 | GWL14 | LWL74 |
| configurable voltage domain 5 | configurable voltage domain 1 | configurable voltage domain 3 | configurable voltage domain 5 | configurable voltage domain 7 | GWL15 | LWL75 |
| configurable voltage domain 6 | configurable voltage domain 0 | configurable voltage domain 2 | configurable voltage domain 4 | configurable voltage domain 6 | GWL16 | LWL76 |
| configurable voltage domain 7 | configurable voltage domain 1 | configurable voltage domain 3 | configurable voltage domain 5 | configurable voltage domain 7 | GWL17 | LWL77 |

TABLE 1-continued

| | | | | | | |
|---|---|---|---|---|---|---|
| configurable voltage domain 8 | configurable voltage domain 0 | configurable voltage domain 2 | configurable voltage domain 4 | configurable voltage domain 6 | GWL18 | LWL78 |
| configurable voltage domain 9 | configurable voltage domain 1 | configurable voltage domain 3 | configurable voltage domain 5 | configurable voltage domain 7 | GWL19 | LWL79 |
| configurable voltage domain 0 | configurable voltage domain 0 | configurable voltage domain 2 | configurable voltage domain 4 | configurable voltage domain 6 | GWL0 | LWL80 |
| configurable voltage domain 1 | configurable voltage domain 1 | configurable voltage domain 3 | configurable voltage domain 5 | configurable voltage domain 7 | GWL1 | LWL81 |
| configurable voltage domain 2 | configurable voltage domain 0 | configurable voltage domain 2 | configurable voltage domain 4 | configurable voltage domain 6 | GWL2 | LWL82 |
| configurable voltage domain 3 | configurable voltage domain 1 | configurable voltage domain 3 | configurable voltage domain 5 | configurable voltage domain 7 | GWL3 | LWL83 |
| configurable voltage domain 4 | configurable voltage domain 0 | configurable voltage domain 2 | configurable voltage domain 4 | configurable voltage domain 6 | GWL4 | LWL84 |
| configurable voltage domain 5 | configurable voltage domain 1 | configurable voltage domain 3 | configurable voltage domain 5 | configurable voltage domain 7 | GWL5 | LWL85 |
| configurable voltage domain 6 | configurable voltage domain 0 | configurable voltage domain 2 | configurable voltage domain 4 | configurable voltage domain 6 | GWL6 | LWL86 |
| configurable voltage domain 7 | configurable voltage domain 1 | configurable voltage domain 3 | configurable voltage domain 5 | configurable voltage domain 7 | GWL7 | LWL87 |
| configurable voltage domain 8 | configurable voltage domain 0 | configurable voltage domain 2 | configurable voltage domain 4 | configurable voltage domain 6 | GWL8 | LWL88 |
| configurable voltage domain 9 | configurable voltage domain 1 | configurable voltage domain 3 | configurable voltage domain 5 | configurable voltage domain 7 | GWL9 | LWL89 |
| configurable voltage domain 0 | configurable voltage domain 0 | configurable voltage domain 2 | configurable voltage domain 4 | configurable voltage domain 6 | GWL10 | LWL90 |
| configurable voltage domain 1 | configurable voltage domain 1 | configurable voltage domain 3 | configurable voltage domain 5 | configurable voltage domain 7 | GWL11 | LWL91 |
| configurable voltage domain 2 | configurable voltage domain 0 | configurable voltage domain 2 | configurable voltage domain 4 | configurable voltage domain 6 | GWL12 | LWL92 |
| configurable voltage domain 3 | configurable voltage domain 1 | configurable voltage domain 3 | configurable voltage domain 5 | configurable voltage domain 7 | GWL13 | LWL93 |
| configurable voltage domain 4 | configurable voltage domain 0 | configurable voltage domain 2 | configurable voltage domain 4 | configurable voltage domain 6 | GWL14 | LWL94 |
| configurable voltage domain 5 | configurable voltage domain 1 | configurable voltage domain 3 | configurable voltage domain 5 | configurable voltage domain 7 | GWL15 | LWL95 |
| configurable voltage domain 6 | configurable voltage domain 0 | configurable voltage domain 2 | configurable voltage domain 4 | configurable voltage domain 6 | GWL16 | LWL96 |
| configurable voltage domain 7 | configurable voltage domain 1 | configurable voltage domain 3 | configurable voltage domain 5 | configurable voltage domain 7 | GWL17 | LWL97 |
| configurable voltage domain 8 | configurable voltage domain 0 | configurable voltage domain 2 | configurable voltage domain 4 | configurable voltage domain 6 | GWL18 | LWL98 |
| configurable voltage domain 9 | configurable voltage domain 1 | configurable voltage domain 3 | configurable voltage domain 5 | configurable voltage domain 7 | GWL19 | LWL99 |
| configurable voltage domain 0 | configurable voltage domain 0 | configurable voltage domain 2 | configurable voltage domain 4 | configurable voltage domain 6 | GWL0 | LWL100 |
| configurable voltage domain 1 | configurable voltage domain 1 | configurable voltage domain 3 | configurable voltage domain 5 | configurable voltage domain 7 | GWL1 | LWL101 |
| configurable voltage domain 2 | configurable voltage domain 0 | configurable voltage domain 2 | configurable voltage domain 4 | configurable voltage domain 6 | GWL2 | LWL102 |
| configurable voltage domain 3 | configurable voltage domain 1 | configurable voltage domain 3 | configurable voltage domain 5 | configurable voltage domain 7 | GWL3 | LWL103 |
| configurable voltage domain 4 | configurable voltage domain 0 | configurable voltage domain 2 | configurable voltage domain 4 | configurable voltage domain 6 | GWL4 | LWL104 |
| configurable voltage domain 5 | configurable voltage domain 1 | configurable voltage domain 3 | configurable voltage domain 5 | configurable voltage domain 7 | GWL5 | LWL105 |
| configurable voltage domain 6 | configurable voltage domain 0 | configurable voltage domain 2 | configurable voltage domain 4 | configurable voltage domain 6 | GWL6 | LWL106 |
| configurable voltage domain 7 | configurable voltage domain 1 | configurable voltage domain 3 | configurable voltage domain 5 | configurable voltage domain 7 | GWL7 | LWL107 |
| configurable voltage domain 8 | configurable voltage domain 0 | configurable voltage domain 2 | configurable voltage domain 4 | configurable voltage domain 6 | GWL8 | LWL108 |
| configurable voltage domain 9 | configurable voltage domain 1 | configurable voltage domain 3 | configurable voltage domain 5 | configurable voltage domain 7 | GWL9 | LWL109 |
| configurable voltage domain 0 | configurable voltage domain 0 | configurable voltage domain 2 | configurable voltage domain 4 | configurable voltage domain 6 | GWL10 | LWL110 |
| configurable voltage domain 1 | configurable voltage domain 1 | configurable voltage domain 3 | configurable voltage domain 5 | configurable voltage domain 7 | GWL11 | LWL111 |
| configurable voltage domain 2 | configurable voltage domain 0 | configurable voltage domain 2 | configurable voltage domain 4 | configurable voltage domain 6 | GWL12 | LWL112 |
| configurable voltage domain 3 | configurable voltage domain 1 | configurable voltage domain 3 | configurable voltage domain 5 | configurable voltage domain 7 | GWL13 | LWL113 |
| configurable voltage domain 4 | configurable voltage domain 0 | configurable voltage domain 2 | configurable voltage domain 4 | configurable voltage domain 6 | GWL14 | LWL114 |
| configurable voltage domain 5 | configurable voltage domain 1 | configurable voltage domain 3 | configurable voltage domain 5 | configurable voltage domain 7 | GWL15 | LWL115 |
| configurable voltage domain 6 | configurable voltage domain 0 | configurable voltage domain 2 | configurable voltage domain 4 | configurable voltage domain 6 | GWL16 | LWL116 |
| configurable voltage domain 7 | configurable voltage domain 1 | configurable voltage domain 3 | configurable voltage domain 5 | configurable voltage domain 7 | GWL17 | LWL117 |

TABLE 1-continued

| | | | | | | |
|---|---|---|---|---|---|---|
| configurable voltage domain 8 | configurable voltage domain 0 | configurable voltage domain 2 | configurable voltage domain 4 | configurable voltage domain 6 | GWL18 | LWL118 |
| configurable voltage domain 9 | configurable voltage domain 1 | configurable voltage domain 3 | configurable voltage domain 5 | configurable voltage domain 7 | GWL19 | LWL119 |
| configurable voltage domain 0 | configurable voltage domain 0 | configurable voltage domain 2 | configurable voltage domain 4 | configurable voltage domain 6 | GWL0 | LWL120 |
| configurable voltage domain 1 | configurable voltage domain 1 | configurable voltage domain 3 | configurable voltage domain 5 | configurable voltage domain 7 | GWL1 | LWL121 |
| configurable voltage domain 2 | configurable voltage domain 0 | configurable voltage domain 2 | configurable voltage domain 4 | configurable voltage domain 6 | GWL2 | LWL122 |
| configurable voltage domain 3 | configurable voltage domain 1 | configurable voltage domain 3 | configurable voltage domain 5 | configurable voltage domain 7 | GWL3 | LWL123 |
| configurable voltage domain 4 | configurable voltage domain 0 | configurable voltage domain 2 | configurable voltage domain 4 | configurable voltage domain 6 | GWL4 | LWL124 |
| configurable voltage domain 5 | configurable voltage domain 1 | configurable voltage domain 3 | configurable voltage domain 5 | configurable voltage domain 7 | GWL5 | LWL125 |
| configurable voltage domain 6 | configurable voltage domain 0 | configurable voltage domain 2 | configurable voltage domain 4 | configurable voltage domain 6 | GWL6 | LWL126 |
| configurable voltage domain 7 | configurable voltage domain 1 | configurable voltage domain 3 | configurable voltage domain 5 | configurable voltage domain 7 | GWL7 | LWL127 |
| configurable voltage domain 8 | configurable voltage domain 0 | configurable voltage domain 2 | configurable voltage domain 4 | configurable voltage domain 6 | GWL8 | LWL128 |
| configurable voltage domain 9 | configurable voltage domain 1 | configurable voltage domain 3 | configurable voltage domain 5 | configurable voltage domain 7 | GWL9 | LWL129 |
| configurable voltage domain 0 | configurable voltage domain 0 | configurable voltage domain 2 | configurable voltage domain 4 | configurable voltage domain 6 | GWL10 | LWL130 |
| configurable voltage domain 1 | configurable voltage domain 1 | configurable voltage domain 3 | configurable voltage domain 5 | configurable voltage domain 7 | GWL11 | LWL131 |
| configurable voltage domain 2 | configurable voltage domain 0 | configurable voltage domain 2 | configurable voltage domain 4 | configurable voltage domain 6 | GWL12 | LWL132 |
| configurable voltage domain 3 | configurable voltage domain 1 | configurable voltage domain 3 | configurable voltage domain 5 | configurable voltage domain 7 | GWL13 | LWL133 |
| configurable voltage domain 4 | configurable voltage domain 0 | configurable voltage domain 2 | configurable voltage domain 4 | configurable voltage domain 6 | GWL14 | LWL134 |
| configurable voltage domain 5 | configurable voltage domain 1 | configurable voltage domain 3 | configurable voltage domain 5 | configurable voltage domain 7 | GWL15 | LWL135 |
| configurable voltage domain 6 | configurable voltage domain 0 | configurable voltage domain 2 | configurable voltage domain 4 | configurable voltage domain 6 | GWL16 | LWL136 |
| configurable voltage domain 7 | configurable voltage domain 1 | configurable voltage domain 3 | configurable voltage domain 5 | configurable voltage domain 7 | GWL17 | LWL137 |
| configurable voltage domain 8 | configurable voltage domain 0 | configurable voltage domain 2 | configurable voltage domain 4 | configurable voltage domain 6 | GWL18 | LWL138 |
| configurable voltage domain 9 | configurable voltage domain 1 | configurable voltage domain 3 | configurable voltage domain 5 | configurable voltage domain 7 | GWL19 | LWL139 |
| configurable voltage domain 0 | configurable voltage domain 0 | configurable voltage domain 2 | configurable voltage domain 4 | configurable voltage domain 6 | GWL0 | LWL140 |
| configurable voltage domain 1 | configurable voltage domain 1 | configurable voltage domain 3 | configurable voltage domain 5 | configurable voltage domain 7 | GWL1 | LWL141 |
| configurable voltage domain 2 | configurable voltage domain 0 | configurable voltage domain 2 | configurable voltage domain 4 | configurable voltage domain 6 | GWL2 | LWL142 |
| configurable voltage domain 3 | configurable voltage domain 1 | configurable voltage domain 3 | configurable voltage domain 5 | configurable voltage domain 7 | GWL3 | LWL143 |
| configurable voltage domain 4 | configurable voltage domain 0 | configurable voltage domain 2 | configurable voltage domain 4 | configurable voltage domain 6 | GWL4 | LWL144 |
| configurable voltage domain 5 | configurable voltage domain 1 | configurable voltage domain 3 | configurable voltage domain 5 | configurable voltage domain 7 | GWL5 | LWL145 |
| configurable voltage domain 6 | configurable voltage domain 0 | configurable voltage domain 2 | configurable voltage domain 4 | configurable voltage domain 6 | GWL6 | LWL146 |
| configurable voltage domain 7 | configurable voltage domain 1 | configurable voltage domain 3 | configurable voltage domain 5 | configurable voltage domain 7 | GWL7 | LWL147 |
| configurable voltage domain 8 | configurable voltage domain 0 | configurable voltage domain 2 | configurable voltage domain 4 | configurable voltage domain 6 | GWL8 | LWL148 |
| configurable voltage domain 9 | configurable voltage domain 1 | configurable voltage domain 3 | configurable voltage domain 5 | configurable voltage domain 7 | GWL9 | LWL149 |
| configurable voltage domain 0 | configurable voltage domain 0 | configurable voltage domain 2 | configurable voltage domain 4 | configurable voltage domain 6 | GWL10 | LWL150 |
| configurable voltage domain 1 | configurable voltage domain 1 | configurable voltage domain 3 | configurable voltage domain 5 | configurable voltage domain 7 | GWL11 | LWL151 |
| configurable voltage domain 2 | configurable voltage domain 0 | configurable voltage domain 2 | configurable voltage domain 4 | configurable voltage domain 6 | GWL12 | LWL152 |
| configurable voltage domain 3 | configurable voltage domain 1 | configurable voltage domain 3 | configurable voltage domain 5 | configurable voltage domain 7 | GWL13 | LWL153 |
| configurable voltage domain 4 | configurable voltage domain 0 | configurable voltage domain 2 | configurable voltage domain 4 | configurable voltage domain 6 | GWL14 | LWL154 |
| configurable voltage domain 5 | configurable voltage domain 1 | configurable voltage domain 3 | configurable voltage domain 5 | configurable voltage domain 7 | GWL15 | LWL155 |
| configurable voltage domain 6 | configurable voltage domain 0 | configurable voltage domain 2 | configurable voltage domain 4 | configurable voltage domain 6 | GWL16 | LWL156 |
| configurable voltage domain 7 | configurable voltage domain 1 | configurable voltage domain 3 | configurable voltage domain 5 | configurable voltage domain 7 | GWL17 | LWL157 |

TABLE 1-continued

| | | | | | | |
|---|---|---|---|---|---|---|
| configurable voltage domain 8 | configurable voltage domain 0 | configurable voltage domain 2 | configurable voltage domain 4 | configurable voltage domain 6 | GWL18 | LWL158 |
| configurable voltage domain 9 | configurable voltage domain 1 | configurable voltage domain 3 | configurable voltage domain 5 | configurable voltage domain 7 | GWL19 | LWL159 |
| configurable voltage domain 0 | configurable voltage domain 0 | configurable voltage domain 2 | configurable voltage domain 4 | configurable voltage domain 6 | GWL0 | LWL160 |
| configurable voltage domain 1 | configurable voltage domain 1 | configurable voltage domain 3 | configurable voltage domain 5 | configurable voltage domain 7 | GWL1 | LWL161 |
| configurable voltage domain 2 | configurable voltage domain 0 | configurable voltage domain 2 | configurable voltage domain 4 | configurable voltage domain 6 | GWL2 | LWL162 |
| configurable voltage domain 3 | configurable voltage domain 1 | configurable voltage domain 3 | configurable voltage domain 5 | configurable voltage domain 7 | GWL3 | LWL163 |
| configurable voltage domain 4 | configurable voltage domain 0 | configurable voltage domain 2 | configurable voltage domain 4 | configurable voltage domain 6 | GWL4 | LWL164 |
| configurable voltage domain 5 | configurable voltage domain 1 | configurable voltage domain 3 | configurable voltage domain 5 | configurable voltage domain 7 | GWL5 | LWL165 |
| configurable voltage domain 6 | configurable voltage domain 0 | configurable voltage domain 2 | configurable voltage domain 4 | configurable voltage domain 6 | GWL6 | LWL166 |
| configurable voltage domain 7 | configurable voltage domain 1 | configurable voltage domain 3 | configurable voltage domain 5 | configurable voltage domain 7 | GWL7 | LWL167 |
| configurable voltage domain 8 | configurable voltage domain 0 | configurable voltage domain 2 | configurable voltage domain 4 | configurable voltage domain 6 | GWL8 | LWL168 |
| configurable voltage domain 9 | configurable voltage domain 1 | configurable voltage domain 3 | configurable voltage domain 5 | configurable voltage domain 7 | GWL9 | LWL169 |
| configurable voltage domain 0 | configurable voltage domain 0 | configurable voltage domain 2 | configurable voltage domain 4 | configurable voltage domain 6 | GWL10 | LWL170 |
| configurable voltage domain 1 | configurable voltage domain 1 | configurable voltage domain 3 | configurable voltage domain 5 | configurable voltage domain 7 | GWL11 | LWL171 |
| configurable voltage domain 2 | configurable voltage domain 0 | configurable voltage domain 2 | configurable voltage domain 4 | configurable voltage domain 6 | GWL12 | LWL172 |
| configurable voltage domain 3 | configurable voltage domain 1 | configurable voltage domain 3 | configurable voltage domain 5 | configurable voltage domain 7 | GWL13 | LWL173 |
| configurable voltage domain 4 | configurable voltage domain 0 | configurable voltage domain 2 | configurable voltage domain 4 | configurable voltage domain 6 | GWL14 | LWL174 |
| configurable voltage domain 5 | configurable voltage domain 1 | configurable voltage domain 3 | configurable voltage domain 5 | configurable voltage domain 7 | GWL15 | LWL175 |
| configurable voltage domain 6 | configurable voltage domain 0 | configurable voltage domain 2 | configurable voltage domain 4 | configurable voltage domain 6 | GWL16 | LWL176 |
| configurable voltage domain 7 | configurable voltage domain 1 | configurable voltage domain 3 | configurable voltage domain 5 | configurable voltage domain 7 | GWL17 | LWL177 |
| configurable voltage domain 8 | configurable voltage domain 0 | configurable voltage domain 2 | configurable voltage domain 4 | configurable voltage domain 6 | GWL18 | LWL178 |
| configurable voltage domain 9 | configurable voltage domain 1 | configurable voltage domain 3 | configurable voltage domain 5 | configurable voltage domain 7 | GWL19 | LWL179 |
| configurable voltage domain 0 | configurable voltage domain 0 | configurable voltage domain 2 | configurable voltage domain 4 | configurable voltage domain 6 | GWL0 | LWL180 |
| configurable voltage domain 1 | configurable voltage domain 1 | configurable voltage domain 3 | configurable voltage domain 5 | configurable voltage domain 7 | GWL1 | LWL181 |
| configurable voltage domain 2 | configurable voltage domain 0 | configurable voltage domain 2 | configurable voltage domain 4 | configurable voltage domain 6 | GWL2 | LWL182 |
| configurable voltage domain 3 | configurable voltage domain 1 | configurable voltage domain 3 | configurable voltage domain 5 | configurable voltage domain 7 | GWL3 | LWL183 |
| configurable voltage domain 4 | configurable voltage domain 0 | configurable voltage domain 2 | configurable voltage domain 4 | configurable voltage domain 6 | GWL4 | LWL184 |
| configurable voltage domain 5 | configurable voltage domain 1 | configurable voltage domain 3 | configurable voltage domain 5 | configurable voltage domain 7 | GWL5 | LWL185 |
| configurable voltage domain 6 | configurable voltage domain 0 | configurable voltage domain 2 | configurable voltage domain 4 | configurable voltage domain 6 | GWL6 | LWL186 |
| configurable voltage domain 7 | configurable voltage domain 1 | configurable voltage domain 3 | configurable voltage domain 5 | configurable voltage domain 7 | GWL7 | LWL187 |
| configurable voltage domain 8 | configurable voltage domain 0 | configurable voltage domain 2 | configurable voltage domain 4 | configurable voltage domain 6 | GWL8 | LWL188 |
| configurable voltage domain 9 | configurable voltage domain 1 | configurable voltage domain 3 | configurable voltage domain 5 | configurable voltage domain 7 | GWL9 | LWL189 |
| configurable voltage domain 0 | configurable voltage domain 0 | configurable voltage domain 2 | configurable voltage domain 4 | configurable voltage domain 6 | GWL10 | LWL190 |
| configurable voltage domain 1 | configurable voltage domain 1 | configurable voltage domain 3 | configurable voltage domain 5 | configurable voltage domain 7 | GWL11 | LWL191 |
| configurable voltage domain 2 | configurable voltage domain 0 | configurable voltage domain 2 | configurable voltage domain 4 | configurable voltage domain 6 | GWL12 | LWL192 |
| configurable voltage domain 3 | configurable voltage domain 1 | configurable voltage domain 3 | configurable voltage domain 5 | configurable voltage domain 7 | GWL13 | LWL193 |
| configurable voltage domain 4 | configurable voltage domain 0 | configurable voltage domain 2 | configurable voltage domain 4 | configurable voltage domain 6 | GWL14 | LWL194 |
| configurable voltage domain 5 | configurable voltage domain 1 | configurable voltage domain 3 | configurable voltage domain 5 | configurable voltage domain 7 | GWL15 | LWL195 |
| configurable voltage domain 6 | configurable voltage domain 0 | configurable voltage domain 2 | configurable voltage domain 4 | configurable voltage domain 6 | GWL16 | LWL196 |
| configurable voltage domain 7 | configurable voltage domain 1 | configurable voltage domain 3 | configurable voltage domain 5 | configurable voltage domain 7 | GWL17 | LWL197 |

TABLE 1-continued

| | | | | | GWL | LWL |
|---|---|---|---|---|---|---|
| configurable voltage domain 8 | configurable voltage domain 0 | configurable voltage domain 2 | configurable voltage domain 4 | configurable voltage domain 6 | GWL18 | LWL198 |
| configurable voltage domain 9 | configurable voltage domain 1 | configurable voltage domain 3 | configurable voltage domain 5 | configurable voltage domain 7 | GWL19 | LWL199 |
| configurable voltage domain 0 | configurable voltage domain 0 | configurable voltage domain 2 | configurable voltage domain 4 | configurable voltage domain 6 | GWL0 | LWL200 |
| configurable voltage domain 1 | configurable voltage domain 1 | configurable voltage domain 3 | configurable voltage domain 5 | configurable voltage domain 7 | GWL1 | LWL201 |
| configurable voltage domain 2 | configurable voltage domain 0 | configurable voltage domain 2 | configurable voltage domain 4 | configurable voltage domain 6 | GWL2 | LWL202 |
| configurable voltage domain 3 | configurable voltage domain 1 | configurable voltage domain 3 | configurable voltage domain 5 | configurable voltage domain 7 | GWL3 | LWL203 |
| configurable voltage domain 4 | configurable voltage domain 0 | configurable voltage domain 2 | configurable voltage domain 4 | configurable voltage domain 6 | GWL4 | LWL204 |
| configurable voltage domain 5 | configurable voltage domain 1 | configurable voltage domain 3 | configurable voltage domain 5 | configurable voltage domain 7 | GWL5 | LWL205 |
| configurable voltage domain 6 | configurable voltage domain 0 | configurable voltage domain 2 | configurable voltage domain 4 | configurable voltage domain 6 | GWL6 | LWL206 |
| configurable voltage domain 7 | configurable voltage domain 1 | configurable voltage domain 3 | configurable voltage domain 5 | configurable voltage domain 7 | GWL7 | LWL207 |
| configurable voltage domain 8 | configurable voltage domain 0 | configurable voltage domain 2 | configurable voltage domain 4 | configurable voltage domain 6 | GWL8 | LWL208 |
| configurable voltage domain 9 | configurable voltage domain 1 | configurable voltage domain 3 | configurable voltage domain 5 | configurable voltage domain 7 | GWL9 | LWL209 |
| configurable voltage domain 0 | configurable voltage domain 0 | configurable voltage domain 2 | configurable voltage domain 4 | configurable voltage domain 6 | GWL10 | LWL210 |
| configurable voltage domain 1 | configurable voltage domain 1 | configurable voltage domain 3 | configurable voltage domain 5 | configurable voltage domain 7 | GWL11 | LWL211 |
| configurable voltage domain 2 | configurable voltage domain 0 | configurable voltage domain 2 | configurable voltage domain 4 | configurable voltage domain 6 | GWL12 | LWL212 |
| configurable voltage domain 3 | configurable voltage domain 1 | configurable voltage domain 3 | configurable voltage domain 5 | configurable voltage domain 7 | GWL13 | LWL213 |
| configurable voltage domain 4 | configurable voltage domain 0 | configurable voltage domain 2 | configurable voltage domain 4 | configurable voltage domain 6 | GWL14 | LWL214 |
| configurable voltage domain 5 | configurable voltage domain 1 | configurable voltage domain 3 | configurable voltage domain 5 | configurable voltage domain 7 | GWL15 | LWL215 |
| configurable voltage domain 6 | configurable voltage domain 0 | configurable voltage domain 2 | configurable voltage domain 4 | configurable voltage domain 6 | GWL16 | LWL216 |
| configurable voltage domain 7 | configurable voltage domain 1 | configurable voltage domain 3 | configurable voltage domain 5 | configurable voltage domain 7 | GWL17 | LWL217 |
| configurable voltage domain 8 | configurable voltage domain 0 | configurable voltage domain 2 | configurable voltage domain 4 | configurable voltage domain 6 | GWL18 | LWL218 |
| configurable voltage domain 9 | configurable voltage domain 1 | configurable voltage domain 3 | configurable voltage domain 5 | configurable voltage domain 7 | GWL19 | LWL219 |
| configurable voltage domain 0 | configurable voltage domain 0 | configurable voltage domain 2 | configurable voltage domain 4 | configurable voltage domain 6 | GWL0 | LWL220 |
| configurable voltage domain 1 | configurable voltage domain 1 | configurable voltage domain 3 | configurable voltage domain 5 | configurable voltage domain 7 | GWL1 | LWL221 |
| configurable voltage domain 2 | configurable voltage domain 0 | configurable voltage domain 2 | configurable voltage domain 4 | configurable voltage domain 6 | GWL2 | LWL222 |
| configurable voltage domain 3 | configurable voltage domain 1 | configurable voltage domain 3 | configurable voltage domain 5 | configurable voltage domain 7 | GWL3 | LWL223 |
| configurable voltage domain 4 | configurable voltage domain 0 | configurable voltage domain 2 | configurable voltage domain 4 | configurable voltage domain 6 | GWL4 | LWL224 |
| configurable voltage domain 5 | configurable voltage domain 1 | configurable voltage domain 3 | configurable voltage domain 5 | configurable voltage domain 7 | GWL5 | LWL225 |
| configurable voltage domain 6 | configurable voltage domain 0 | configurable voltage domain 2 | configurable voltage domain 4 | configurable voltage domain 6 | GWL6 | LWL226 |
| configurable voltage domain 7 | configurable voltage domain 1 | configurable voltage domain 3 | configurable voltage domain 5 | configurable voltage domain 7 | GWL7 | LWL227 |
| configurable voltage domain 8 | configurable voltage domain 0 | configurable voltage domain 2 | configurable voltage domain 4 | configurable voltage domain 6 | GWL8 | LWL228 |
| configurable voltage domain 9 | configurable voltage domain 1 | configurable voltage domain 3 | configurable voltage domain 5 | configurable voltage domain 7 | GWL9 | LWL229 |
| configurable voltage domain 0 | configurable voltage domain 0 | configurable voltage domain 2 | configurable voltage domain 4 | configurable voltage domain 6 | GWL10 | LWL230 |
| configurable voltage domain 1 | configurable voltage domain 1 | configurable voltage domain 3 | configurable voltage domain 5 | configurable voltage domain 7 | GWL11 | LWL231 |

| | program | program | read | | | |
|---|---|---|---|---|---|---|
| | Plane0-Plane3 | Plane0-Plane3 | Plane0 | Plane1 | Plane2 | Plane3 |
| | configurable voltage domain 0 configurable voltage domain 1 configurable voltage domain 2 configurable | gwlu0 | gwlu0 | gwlu3 | gwlu6 | gwlu9 |

TABLE 1-continued

| | | | | | |
|---|---|---|---|---|---|
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu1 | gwlu0 | gwlu3 | gwlu6 | gwlu9 |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu2 | gwlu0 | gwlu3 | gwlu6 | gwlu9 |
| voltage domain 0 configurable | | | | | |
| voltage domain 1 configurable | | | | | |
| voltage domain 2 configurable | | | | | |

TABLE 1-continued

| | | | | | |
|---|---|---|---|---|---|
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu3 | gwlu0 | gwlu3 | gwlu6 | gwlu9 |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu4 | gwlu1 | gwlu4 | gwlu7 | gwlu10 |
| voltage domain 0 configurable | | | | | |
| voltage domain 1 configurable | | | | | |
| voltage domain 2 configurable | | | | | |

TABLE 1-continued

| | | | | | |
|---|---|---|---|---|---|
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu5 | gwlu1 | gwlu4 | gwlu7 | gwlu10 |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu6 | gwlu1 | gwlu4 | gwlu7 | gwlu10 |
| voltage domain 0 configurable | | | | | |
| voltage domain 1 configurable | | | | | |
| voltage domain 2 configurable | | | | | |

TABLE 1-continued

| | | | | | |
|---|---|---|---|---|---|
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu7 | gwlu1 | gwlu4 | gwlu7 | gwlu10 |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu8 | gwlu2 | gwlu5 | gwlu8 | gwlu11 |
| voltage domain 0 configurable | | | | | |
| voltage domain 1 configurable | | | | | |
| voltage domain 2 configurable | | | | | |

TABLE 1-continued

| | | | | | |
|---|---|---|---|---|---|
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu9 | gwlu2 | gwlu5 | gwlu6 | gwlu11 |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu10 | gwlu2 | gwlu5 | gwlu8 | gwlu11 |
| voltage domain 0 configurable | | | | | |
| voltage domain 1 configurable | | | | | |
| voltage domain 2 configurable | | | | | |

TABLE 1-continued

| | | | | | |
|---|---|---|---|---|---|
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | gwlu11 | gwlu2 | gwlu5 | gwlu8 | gwlu11 |
| voltage domain 0 configurable | | | | | |
| voltage domain 1 configurable | | | | | |
| voltage domain 2 configurable | | | | | |
| voltage domain 3 configurable | | | | | |
| voltage domain 4 configurable | | | | | |
| voltage domain 5 configurable | | | | | |
| voltage domain 6 configurable | | | | | |
| voltage domain 7 configurable | | | | | |
| voltage domain 8 configurable | | | | | |
| voltage domain 9 configurable | | | | | |
| voltage domain 0 configurable | | | | | |
| voltage domain 1 | | | | | |

In some embodiments, the selected voltage selection circuits, the global word line voltage selection circuits, the local word line voltage selection circuits, and the unselected voltage selection circuits all comprise a multiplexer.

In some examples, the memory device includes a three-dimensional NAND memory device.

However, the memory device the embodiment of the present disclosure is not limited to the three-dimensional NAND memory device. In the embodiment of the present disclosure, the memory device may be a semiconductor memory device, including but not limited to a three-dimensional NAND flash memory, a vertical NAND flash memory, a NOR flash memory, a Dynamic Random Access Memory (DRAM), a Ferroelectric Random Access Memory (FRAM), a Magnetoresistive Random Access Memory (MRAM), a Phase Change Random Access Memory (PCRAM), a Resistive Random Access Memory (RRAM) or a Nano Random Access Memory (NRAM), etc.

An embodiment of the present disclosure provides a memory device, the memory device comprises a memory cell array and a peripheral circuit coupled to the memory cell array; the memory cell array includes a plurality of memory planes; the peripheral circuit includes a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane; the selected voltage selection circuits are configured to select a voltage from a plurality of selected voltages to output to the global word line voltage selection circuits; the global word line voltage selection circuits are configured to select a voltage from unselected voltages and the voltage output from the selected voltage selection circuits to output to the local word line voltage selection circuits; during a program operation, the plurality of memory planes share the plurality of selected voltage selection circuits; and during a read operation, each memory plane uses a part of the plurality of selected voltage selection circuits to perform voltage selection. In the embodiment of the present disclosure, during the program operation, the plurality of memory planes share the plurality of selected voltage selection circuits, while during the read operation, each memory plane uses a part of the plurality of selected voltage selection circuits used during the program operation to perform voltage selection. That is, in the embodiment of the present disclosure, the program operation and the read operation share the selected voltage selection circuits, so the selected voltage selection circuits required during the read operation need not to be additionally added. Thus, the total number of the selected voltage selection circuits is small, and the area of the memory device may be reduced, which is beneficial to the miniaturization of the memory device.

An embodiment of the present disclosure also provides a memory system, comprising: one or more memory devices as described in any of the above embodiments; and a memory controller coupled to and controlling the memory device.

Here, with respect to the structure and composition of the memory system, reference may be made to the related structure and composition of the memory system 102 in the aforementioned FIG. 1 and FIG. 2a. For the sake of brevity, details are not repeated here.

In some embodiments, the memory system comprises a memory card or a solid-state hard disk.

Based on the above memory device, a method for operating a memory device is also provided in an embodiment of the present disclosure. The memory device comprises a memory cell array and a peripheral circuit coupled to the memory cell array; the memory cell array includes a plurality of memory planes; the peripheral circuit includes a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane; the selected voltage selection circuits are configured to select a voltage from a plurality of selected voltages to output to the global word line voltage selection circuits; the global word line voltage selection circuits are configured to select a voltage from unselected voltages and the voltage output from the selected voltage selection circuits to output to the local word line voltage selection circuits.

Figure 14:
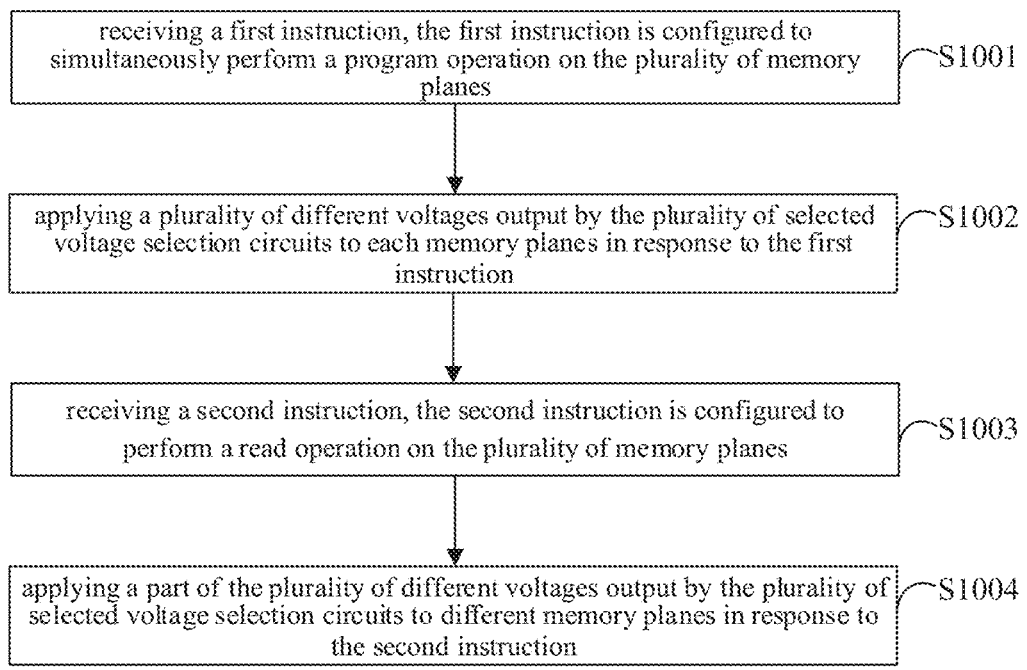
FIG. 14 is a schematic flowchart of an implementation of the operation method of a memory device according to an embodiment of the disclosure.

As show in FIG. 14, the method includes: Step S1001: receiving a first instruction, the first instruction is configured to simultaneously perform a program operation on the plurality of memory planes; Step S1002: applying a plurality of different voltages output by the plurality of selected voltage selection circuits to each memory plane in response to the first instruction; Step S1003: receiving a second instruction, the second instruction is configured to perform a read operation on the plurality of memory planes; Step S1004: applying a part of the plurality of different voltages output by the plurality of selected voltage selection circuits to different memory planes respectively in response to the second instruction.

In some embodiments, during the program operation performed on the plurality of memory planes simultaneously, the number of selected voltages corresponding to the plurality of memory planes is a, and the number of the selected voltage selection circuits corresponding to the plurality of memory planes is at least a; and during the read operation performed on the plurality of memory planes, the amber of selected voltages corresponding to each memory plane is b, and the number of the selected voltage selection circuits corresponding to each memory plane is at least b; the number of the memory planes is c, and the relationship among a, b and c is: $a \geq b*c$; wherein, both a and b are positive integers greater than 0, and c is a positive integer greater than 1.

In some embodiments, the peripheral circuit further comprises: a plurality of global word lines corresponding to the global word line voltage selection circuits one-to-one; during the program operation performed on the plurality of memory planes simultaneously, the number of the selected voltage selection circuits corresponding to the plurality of memory planes is a, and the adjacent a global word lines on each memory plane correspond to different selected voltage selection circuits; during the read operation performed on the plurality of memory planes, the global word lines on different memory planes correspond to different selected voltage selection circuits, the number of selected voltage selection circuits corresponding to each memory plane is b, and the adjacent b global word lines on each memory plane correspond to different selected voltage selection circuits.

In some embodiments, the peripheral circuit further comprises: a plurality of unselected voltage selection circuits corresponding to the plurality of memory planes; each unselected voltage selection circuit corresponds to a plurality of local word line voltage selection circuits on one memory plane, each local word line voltage selection circuit corresponds to one unselected voltage selection circuit; each unselected voltage selection circuit is configured to select a voltage from at least one unselected voltage to output to the local word line voltage selection circuits; the method further includes: applying a plurality of different voltages output by the plurality of unselected voltage selection circuits to each memory plane in response to the first instruction; applying a part of the plurality of different voltages output by the plurality of unselected voltage selection circuits respectively to different memory planes in response to the second instruction.

In some embodiments, during the program operation, the number of unselected voltages corresponding to the plurality of memory planes is d, and the number of unselected voltage selection circuits corresponding to the plurality of memory planes is at least d; during the read operation, the number of unselected voltages corresponding to each memory plane is e, and the number of unselected voltage selection circuits corresponding to each memory plane is at least e; the number of the memory planes is c, and the relationship among c, d and e is: $d \geq e*c$; wherein, both d and e are positive integers greater than 0, and c is a positive integer greater than 1.

In some embodiments, each of the memory planes comprises a plurality of word lines; the peripheral circuit further includes a plurality of global word lines corresponding to the global word line voltage selection circuits one-to-one, and a plurality of local word lines corresponding to the local word line voltage selection circuits one-to-one; wherein, each global word line corresponds to the plurality of local word lines; each local word line corresponds to one global word line, and each local word line corresponds to one word line; the global word line voltage selection circuits output the voltage to the local word line voltage selection circuits through the global word lines; the local word line voltage selection circuits output the voltage to the corresponding word lines through the local word lines.

In some embodiments, an asynchronous multi-plane independent read method is used to perform the read operation on the plurality of memory planes during the read operation performed on the plurality of memory planes.

It is to be understood that reference to "one embodiment" or "an embodiment" throughout the specification means that particular features, structures, or characteristics associated with the embodiment are included in at least an embodiment of the present disclosure. Thus, appearances of "in one embodiment" or "in an embodiment" in various places throughout this specification are not necessarily referring to the same embodiment. Furthermore, the particular features, structures, or characteristics may be combined in any suitable manner in one or more embodiments. It should be understood that, in various embodiments of the present disclosure, the orders of the above-mentioned processes does not imply the sequence of execution, and the execution sequence of processes should be determined by its functions and internal logic, without limiting the implemented processes of the embodiments of the present disclosure. The above-mentioned orders of the embodiments of the present disclosure are only for description, and do not represent the advantages or disadvantages of the embodiments.

The methods disclosed in the several method embodiments provided in the present disclosure can be combined arbitrarily without conflict to obtain new method embodiments.

The above are only exemplary implementations of the present disclosure, but the protection scope of the present disclosure is not limited to this. Any changes or substitutions will be apparent for the skilled in the art within the technical scope disclosed in the present disclosure, and should be covered by the protection scope of the present disclosure. Therefore, the protection scope of the present disclosure should be based on the protection scope of the claims.

What is claimed is:

1. A memory device, comprising a memory cell array and a peripheral circuit coupled to the memory cell array;
   the memory cell array comprises a plurality of memory planes;
   the peripheral circuit comprises a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane;
   the plurality of selected voltage selection circuits are configured to select a voltage from a plurality of selected voltages to output to the global word line voltage selection circuits; the global word line voltage selection circuits are configured to select a voltage from unselected voltages and the voltage output from the plurality of selected voltage selection circuits to output to the local word line voltage selection circuits;
   during a program operation, the plurality of memory planes share the plurality of selected voltage selection circuits; and
   during a read operation, each memory plane uses a part of the plurality of selected voltage selection circuits respectively to perform voltage selection.

2. The memory device according to claim 1, wherein
   during the program operation, a number of the selected voltages corresponding to the plurality of memory planes is a, and a number of the selected voltage selection circuits corresponding to the plurality of memory planes is at least a;
   during the read operation, a number of the selected voltages corresponding to each memory plane is b, and a number of the selected voltage selection circuits corresponding to each memory plane is at least b; and
   a number of the memory planes is c, and a relationship among a, b, and c is: $a \geq b*c$; wherein both a and b are positive integers greater than 0, and c is a positive integer greater than 1.

3. The memory device according to claim 2, wherein
   the peripheral circuit further comprises a plurality of global word lines corresponding to the global word line voltage selection circuits one-to-one;
   during the program operation, the number of the selected voltage selection circuits corresponding to the plurality of memory planes is a, and adjacent a global word lines on each memory plane correspond to different selected voltage selection circuits; and
   during the read operation, the global word lines on different memory planes correspond to different selected voltage selection circuits, the number of the selected voltage selection circuits corresponding to each memory plane is b, and adjacent b global word lines on each memory plane correspond to different selected voltage selection circuits.

4. The memory device according to claim 1, wherein
   the peripheral circuit further comprises a plurality of unselected voltage selection circuits corresponding to the plurality of memory planes; each unselected voltage selection circuit corresponds to the plurality of local word line voltage selection circuits on one memory plane, each local word line voltage selection circuit corresponds to one unselected voltage selection circuit;
   each of the plurality of unselected voltage selection circuits is configured to select a voltage from at least one unselected voltage to output to the local word line voltage selection circuits;
   during the program operation, the plurality of memory planes share the plurality of unselected voltage selection circuits; and
   during the read operation, each memory plane uses a part of the plurality of unselected voltage selection circuits respectively to perform voltage selection.

5. The memory device according to claim 4, wherein
   during the program operation, a number of the unselected voltages corresponding to the plurality of memory planes is d, and a number of the unselected voltage selection circuits corresponding to the plurality of memory planes is at least d;
   during the read operation, a number of the unselected voltages corresponding to each memory plane is e, and a number of the unselected voltage selection circuits corresponding to each memory plane is at least e; and
   a number of the memory planes is c, and a relationship among c, d, and e is: $d \geq e*c$;
   wherein both d and e are positive integers greater than 0, and c is a positive integer greater than 1.

6. The memory device according to claim 4, wherein
   each of the memory planes comprises a plurality of word lines;
   the peripheral circuit further comprises a plurality of global word lines corresponding to the global word line voltage selection circuits one-to-one, and a plurality of local word lines corresponding to the local word line voltage selection circuits one-to-one, wherein each of the global word lines corresponds to the plurality of local word lines; each local word line corresponds to one global word line, and each local word line corresponds to one word line;

the global word line voltage selection circuits output the voltage to the local word line voltage selection circuits through the global word lines; and the local word line voltage selection circuits output the voltage to corresponding word lines through the local word lines.

7. The memory device according to claim 4, wherein the selected voltage selection circuits, the global word line voltage selection circuits, the local word line voltage selection circuits, and the unselected voltage selection circuits all comprise a multiplexer.

8. A memory system, comprising one or more memory devices and a memory controller coupled to and configured to control the one or more memory devices, wherein each of the memory devices comprises a memory cell array and a peripheral circuit coupled to the memory cell array;

the memory cell array comprises a plurality of memory planes;

the peripheral circuit comprises a plurality of selected voltage selection circuits corresponding to the plurality of memory planes, a plurality of global word line voltage selection circuits respectively corresponding to each memory plane, and a plurality of local word line voltage selection circuits respectively corresponding to each memory plane;

the plurality of selected voltage selection circuits are configured to select a voltage from a plurality of selected voltages to output to the global word line voltage selection circuits; the global word line voltage selection circuits are configured to select a voltage from unselected voltages and the voltage output from the plurality of selected voltage selection circuits to output to the local word line voltage selection circuits;

during a program operation, the plurality of memory planes share the plurality of selected voltage selection circuits; and during a read operation, each memory plane uses a part of the plurality of selected voltage selection circuits respectively to perform voltage selection.

9. The memory system according to claim 8, wherein during the program operation, a number of the selected voltages corresponding to the plurality of memory planes is a, and a number of the selected voltage selection circuits corresponding to the plurality of memory planes is at least a;

during the read operation, a number of the selected voltages corresponding to each memory plane is b, and a number of the selected voltage selection circuits corresponding to each memory plane is at least b; and a number of the memory planes is c, and a relationship among a, b, and c is: $a \geq b*c$;

wherein both a and b are positive integers greater than 0, and c is a positive integer greater than 1.

10. The memory system according to claim 9, wherein the peripheral circuit further comprises a plurality of global word lines corresponding to the global word line voltage selection circuits one-to-one;

during the program operation, the number of the selected voltage selection circuits corresponding to the plurality of memory planes is a, and adjacent a global word lines on each memory plane correspond to different selected voltage selection circuits; and during the read operation, the global word lines on different memory planes correspond to different selected voltage selection circuits, the number of the selected voltage selection circuits corresponding to each memory plane is b, and adjacent b global word lines on each memory plane correspond to different selected voltage selection circuits.

11. The memory system according to claim 8, wherein the peripheral circuit further comprises a plurality of unselected voltage selection circuits corresponding to the plurality of memory planes; each unselected voltage selection circuit corresponds to the plurality of local word line voltage selection circuits on one memory plane, each local word line voltage selection circuit corresponds to one unselected voltage selection circuit;

each of the plurality of unselected voltage selection circuits is configured to select a voltage from at least one unselected voltage to output to the local word line voltage selection circuits;

during the program operation, the plurality of memory planes share the plurality of unselected voltage selection circuits; and during the read operation, each memory plane uses a part of the plurality of unselected voltage selection circuits respectively to perform voltage selection.

12. The memory system according to claim 11, wherein

During the program operation, a number of the unselected voltages corresponding to the plurality of memory planes is 61, and a number of the unselected voltage selection circuits corresponding to the plurality of memory planes is at least ci;

during the read operation, a number of the unselected voltages corresponding to each memory plane is e, and a number of the unselected voltage selection circuits corresponding to each memory plane is at least e; and a number of the memory planes is c, and a relationship among c, d, and e is: $d \geq e*c$: wherein both d and e are positive integers greater than 0, and c is a positive integer greater than 1.

13. The memory system according to claim 11, wherein each of the memory planes comprises a plurality of word lines;

the peripheral circuit further comprises a plurality of global word lines corresponding to the global word line voltage selection circuits one-to-one, and a plurality of local word lines corresponding to the local word line voltage selection circuits one-to-one, wherein each of the global word lines corresponds to the plurality of local word lines; each local word line corresponds to one global word line, and each local word line corresponds to one word line;

the global word line voltage selection circuits output the voltage to the local word line voltage selection circuits through the global word lines; and the local word line voltage selection circuits output the voltage to corresponding word lines through the local word lines.

14. The memory system according to claim 11, wherein the selected voltage selection circuits, the global word line voltage selection circuits, the local word line voltage selection circuits, and the unselected voltage selection circuits all comprise a multiplexer.

15. The memory system according to claim 8, wherein the memory system comprises a memory card or a solid state hard disk.

16. A method for operating a memory device, wherein the memory device comprises a memory cell array and a peripheral circuit coupled to the memory cell array;

the memory cell array comprises a plurality of memory planes;

the peripheral circuit comprises a plurality of selected voltage selection circuits corresponding to the plurality of memory planes, a plurality of global word line voltage selection circuits respectively corresponding to each memory plane; and a plurality of local word line voltage selection circuits respectively corresponding to each memory plane;

the plurality of selected voltage selection circuits are configured to select a voltage from a plurality of selected voltages to output to the global word line voltage selection circuits; the global word line voltage selection circuits are configured to select a voltage from unselected voltages and the voltage output from the plurality of selected voltage selection circuits to output to the local word line voltage selection circuits;

the method comprises:

receiving a first instruction, wherein the first instruction is configured to simultaneously perform a program operation on the plurality of memory planes;

applying a plurality of different voltages output by the plurality of selected voltage selection circuits to each memory plane in response to the first instruction;

receiving a second instruction, wherein the second instruction is configured to perform a read operation on the plurality of memory planes; and applying a part of the plurality of different voltages output by the plurality of selected voltage selection circuits respectively to different memory planes in response to the second instruction.

17. The method according to claim 16, wherein during the program operation performed on the plurality of memory planes simultaneously, a number of the selected voltages corresponding to the plurality of memory planes is a, and a number of the selected voltage selection circuits corresponding to the plurality of memory planes is at least a;

during the read operation performed on the plurality of memory planes, a number of the selected voltages corresponding to each memory plane is b, and a number of the selected voltage selection circuits corresponding to each memory plane is at least b; and a number of the memory planes is c, and a relationship among a, b, and c is: a≥b*c; wherein both a and b are positive integers greater than 0, and c is a positive integer greater than 1.

18. The method according to claim 17, wherein the peripheral circuit further comprises a plurality of global word lines corresponding to the global word line voltage selection circuits one-to-one;

during the program operation performed on the plurality of memory planes simultaneously, the number of the selected voltage selection circuits corresponding to the plurality of memory planes is a, and adjacent a global word lines on each memory plane correspond to different selected voltage selection circuits; and during the read operation performed on the plurality of memory planes, the global word lines on different memory planes correspond to different selected voltage selection circuits, the number of the selected voltage selection circuits corresponding to each memory plane is b, and adjacent b global word lines on each memory plane correspond to different selected voltage selection circuits.

19. The method according to claim 16, wherein the peripheral circuit further comprises a plurality of unselected voltage selection circuits corresponding to the plurality of memory planes; each unselected voltage selection circuit corresponds to the plurality of local word line voltage selection circuits on one memory plane, each local word line voltage selection circuit corresponds to one unselected voltage selection circuit;

each of the plurality of unselected voltage selection circuits is configured to select a voltage from at least one unselected voltage to output to the local word line voltage selection circuits;

the method further comprises:

applying a plurality of different voltages output by the plurality of unselected voltage selection circuits to each memory plane in response to the first instruction; and applying a part of the plurality of different voltages output by the plurality of unselected voltage selection circuits respectively to different memory planes in response to the second instruction.

20. The method according to claim 19, wherein during the program operation, a number of the unselected voltages corresponding to the plurality of memory planes is d, and a number of the unselected voltage selection circuits corresponding to the plurality of memory planes is at least d;

during the read operation, a number of the unselected voltages corresponding to each memory plane is e, and a number of the unselected voltage selection circuits corresponding to each memory plane is at least e; and a number of the memory planes is c, and a relationship among c, d and, e is: d≥e*c; wherein both d and e are positive integers greater than 0, and c is a positive integer greater than 1.

* * * * *